United States Patent
Ueda et al.

(10) Patent No.: US 9,754,978 B2
(45) Date of Patent: *Sep. 5, 2017

(54) SEMICONDUCTOR DEVICE WITH U-SHAPED ACTIVE PORTION

(71) Applicant: Sharp Kabushiki Kaisha, Osaka-shi, Osaka (JP)

(72) Inventors: Naoki Ueda, Osaka (JP); Sumio Katoh, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/028,238

(22) PCT Filed: Sep. 2, 2014

(86) PCT No.: PCT/JP2014/073012
§ 371 (c)(1),
(2) Date: Apr. 8, 2016

(87) PCT Pub. No.: WO2015/053010
PCT Pub. Date: Apr. 16, 2015

(65) Prior Publication Data
US 2016/0260750 A1    Sep. 8, 2016

(30) Foreign Application Priority Data

Oct. 11, 2013  (JP) ................................ 2013-213936

(51) Int. Cl.
*H01L 27/12* (2006.01)
*H01L 27/115* (2017.01)
(Continued)

(52) U.S. Cl.
CPC ........ *H01L 27/1255* (2013.01); *G02F 1/1368* (2013.01); *H01L 27/088* (2013.01);
(Continued)

(58) Field of Classification Search
CPC ... H01L 27/1255; H01L 45/147; H01L 29/24; H01L 45/1206; H01L 29/42384;
(Continued)

(56) References Cited

U.S. PATENT DOCUMENTS 6,775,171 B2    8/2004  Novosel et al.
9,502,133 B2 *  11/2016 Carvajal ............. H01L 29/7869
(Continued)

FOREIGN PATENT DOCUMENTS

JP    11-097556 A    4/1999
JP    2011-049593 A  3/2011
(Continued)

OTHER PUBLICATIONS

Official Communication issued in International Patent Application No. PCT/JP2014/073012, dated Oct. 28, 2014.

*Primary Examiner* — Shouxiang Hu
(74) *Attorney, Agent, or Firm* — Keating & Bennett, LLP

(57) ABSTRACT

A semiconductor device (1001) includes: a first transistor (10A) having a first channel length L1 and a first channel width W1; and a second transistor (10B) having a second channel length L2 and a second channel width W2, wherein the first transistor (10A) and the second transistor (10B) include an active layer formed from a common oxide semiconductor film, the first transistor (10A) is a memory transistor which is capable of being irreversibly changed from a semiconductor state where a drain current Isd depends on a gate voltage Vg to a resistor state where the drain current Isd does not depend on the gate voltage Vg, and the first channel length L1 is smaller than the second channel length L2.

19 Claims, 26 Drawing Sheets

(51) Int. Cl.

| | |
|---|---|
| *H01L 27/112* | (2006.01) |
| *H01L 27/088* | (2006.01) |
| *H01L 27/10* | (2006.01) |
| *H01L 29/417* | (2006.01) |
| *H01L 29/786* | (2006.01) |
| *G02F 1/1368* | (2006.01) |
| *H01L 29/24* | (2006.01) |
| *H01L 29/423* | (2006.01) |
| *H01L 45/00* | (2006.01) |

(52) U.S. Cl.
CPC .......... *H01L 27/101* (2013.01); *H01L 27/112* (2013.01); *H01L 27/115* (2013.01); *H01L 27/11206* (2013.01); *H01L 27/1225* (2013.01); *H01L 27/1251* (2013.01); *H01L 29/24* (2013.01); *H01L 29/41733* (2013.01); *H01L 29/42384* (2013.01); *H01L 29/7869* (2013.01); *H01L 29/78696* (2013.01); *H01L 45/085* (2013.01); *H01L 45/1206* (2013.01); *H01L 45/147* (2013.01); *H01L 2029/42388* (2013.01)

(58) Field of Classification Search
CPC ............... H01L 45/085; H01L 29/7869; H01L 27/1225; H01L 29/78696; H01L 29/41733; H01L 27/101; H01L 2029/42388; H01L 27/11206; H01L 27/112; H01L 27/1251; H01L 27/115; H01L 27/088; H01L 23/5252

USPC ................. 257/43, 390, 530; 365/94, 96
See application file for complete search history.

(56) References Cited

U.S. PATENT DOCUMENTS

| | | |
|---|---|---|
| 2008/0211024 A1 | 9/2008 | Kato et al. |
| 2009/0061573 A1* | 3/2009 | Miyairi ............... H01L 29/04 438/160 |
| 2010/0002611 A1 | 1/2010 | Umatt et al. |
| 2011/0204365 A1 | 8/2011 | Saito |
| 2012/0138922 A1 | 6/2012 | Yamazaki et al. |
| 2012/0162700 A1 | 6/2012 | Miyazaki |
| 2012/0175610 A1 | 7/2012 | Yamazaki |
| 2014/0334227 A1 | 11/2014 | Ueda |
| 2015/0206977 A1 | 7/2015 | Katoh et al. |
| 2015/0243668 A1 | 8/2015 | Ueda et al. |

FOREIGN PATENT DOCUMENTS

| | | |
|---|---|---|
| JP | 2011-192979 A | 9/2011 |
| JP | 2012-134475 A | 7/2012 |
| JP | 2012-137868 A | 7/2012 |
| JP | 2012-160719 A | 8/2012 |
| JP | 2012-231480 A | 11/2012 |
| WO | 2013/080784 A1 | 6/2013 |
| WO | 2013/190882 A1 | 12/2013 |
| WO | 2014/061633 A1 | 4/2014 |

* cited by examiner (a)

(b)

(a)

(b)

(a)

(b)

(a)

(b)

(a)

(b)

(a)

(b)

(c)

(a)

(b)

(c)

(a)

(b)

(a)

(b)

(c)

(a)

(b)

(c)

(a)

(b)

(c)

SEMICONDUCTOR DEVICE WITH U-SHAPED ACTIVE PORTION

TECHNICAL FIELD

The present invention relates to a semiconductor device which includes a memory transistor.

BACKGROUND ART

Using an element which has a transistor structure (hereinafter, referred to as "memory transistor") as a memory element which can be used as a ROM (read only memory) has been conventionally proposed.

For example, Patent Document 1 discloses a nonvolatile memory transistor which has a MOS transistor structure. In this memory transistor, a high electric field is applied to a gate insulating film so as to cause a dielectric breakdown, whereby writing is realized. Patent Document 2 discloses a memory transistor which utilizes a variation in threshold voltage which can be caused by application of a predetermined writing voltage to a gate.

On the other hand, Patent Document 3 of the present applicant proposes a novel nonvolatile memory transistor which is capable of reducing the power consumption as compared with conventional nonvolatile memory transistors. This memory transistor uses a metal oxide semiconductor in the active layer (channel) and can irreversibly change to a resistor state which exhibits an ohmic resistance characteristic due to Joule heat produced by the drain current, irrespective of the gate voltage. Using such a memory transistor enables to make a voltage for writing lower than the voltages in Patent Documents 1 and 2. Note that, in this specification, the operation of changing an oxide semiconductor of this memory transistor to a resistor state is referred to as "writing". In this memory transistor, the metal oxide semiconductor is a resistor after writing, and therefore, the memory transistor does not work as a transistor. However, in this specification, it is referred to as "memory transistor" even after transition to the resistor. Likewise, even after transition to the resistor, terms such as gate electrode, source electrode, drain electrode, channel electrode, etc., which are constituents of a transistor structure are used.

Patent Document 3 discloses forming a memory transistor in an active matrix substrate of a liquid crystal display device, for example.

CITATION LIST

Patent Literature

Patent Document 1: Specification of U.S. Pat. No. 6,775, 171
Patent Document 2: Japanese Laid-Open Patent Publication No. 11-97556
Patent Document 3: WO 2013/080784

SUMMARY OF INVENTION

Technical Problem

In a semiconductor device such as an active matrix substrate which includes a memory transistor, further increasing the writing speed of the memory transistor has been demanded.

According to research conducted by the present inventors, in the memory transistor of Patent Document 3, the writing speed can be increased by setting a voltage which is applied between the source and the drain of the memory transistor in the case of writing (writing voltage) to a large value. However, it was found that, in the case of writing in the memory transistor, there is a probability that the characteristics of the other transistors provided on the substrate vary. This can be a cause of decrease in reliability of a semiconductor device.

An object of an embodiment of the present invention is to increase the writing speed of a memory transistor while securing the reliability of a semiconductor device.

Solution to Problem

A semiconductor device according to an embodiment of the present invention includes: a substrate; a first transistor supported on the substrate, the first transistor having a first channel length L1 and a first channel width W1; and a second transistor supported on the substrate, the second transistor having a second channel length L2 and a second channel width W2, wherein the first transistor and the second transistor include an active layer formed from a common oxide semiconductor film, the first transistor is a memory transistor which is capable of being irreversibly changed from a semiconductor state where a drain current Isd depends on a gate voltage Vg to a resistor state where the drain current Isd does not depend on the gate voltage Vg, and the first channel length L1 is smaller than the second channel length L2.

A semiconductor device according to another embodiment of the present invention includes: a substrate; a first transistor supported on the substrate, the first transistor having a first channel length L1 and a first channel width W1; and a second transistor supported on the substrate, the second transistor having a second channel length L2 and a second channel width W2, wherein the first transistor and the second transistor include an active layer formed from a common oxide semiconductor film, the first transistor is a memory transistor which is capable of being irreversibly changed to a resistor state where a drain current Isd does not depend on a gate voltage Vg, and the first channel width W1 is greater than the second channel width W2.

In one embodiment, a ratio L1/W1 of the channel length to the channel width in the first transistor, is smaller than a ratio L2/W2 of the channel length to the channel width in the second transistor.

In one embodiment, the first transistor includes a gate electrode, a gate insulating film covering the gate electrode, an active layer provided on the gate insulating film, a source electrode provided on the active layer so as to be in contact with a part of the active layer, and a drain electrode provided on the active layer so as to be in contact with another part of the active layer, and when viewed in a direction normal to the substrate, a portion of the active layer which extends over the gate electrode with the gate insulating film interposed therebetween and which is located between the source electrode and the drain electrode has a U-shape.

In one embodiment, the semiconductor device further includes a memory circuit which includes the first transistor, wherein the second transistor includes a transistor which is a constituent of the memory circuit.

The substrate includes a power supply domain region which includes the first thin film transistor. In one embodiment, the second transistor includes a transistor which is a constituent of a circuit provided in the power supply domain region.

In one embodiment, the channel length L1 of the first transistor is not more than a smallest value of channel lengths of all transistors provided in the power supply domain region, each of which has an active layer formed from the common oxide semiconductor film.

In one embodiment, the semiconductor device is an active matrix substrate, the active matrix substrate including a display region which includes a plurality of pixel electrodes and switching elements each electrically connected with a corresponding one of the plurality of pixel electrodes, and a peripheral region provided in a region other than the display region, the peripheral region including a plurality of circuits, and the second transistor includes at least one of a plurality of transistors which are constituents of the plurality of circuits in the peripheral region.

In one embodiment, the channel length L1 of the first transistor is not more than a smallest value of channel lengths of all transistors provided in the peripheral region, each of which has an active layer formed from the common oxide semiconductor film.

In one embodiment, the second transistor includes a transistor which functions as the switching element.

In one embodiment, a ratio L1/W1 of the channel length to the channel width in the first transistor, is not more than a smallest value of ratios of a channel length to a channel width in all transistors which have an active layer formed from the common oxide semiconductor film.

In one embodiment, the common oxide semiconductor film is an In—Ga—Zn—O based semiconductor film.

In one embodiment, the In—Ga—Zn—O based semiconductor film includes a crystalline portion.

In one embodiment, when the first transistor is in the semiconductor state, while an absolute value of a drain voltage is in a range of not less than 0.1 V and not more than 10 V, there is a voltage range for the gate voltage in which an absolute value of a drain current per unit channel width, Ids/W1, falls in a very small electric current state of not more than $1 \times 10^{-14}$ A/μm, and after transition to the resistor state, even when the gate voltage is set within the voltage range while the absolute value of the drain voltage is in a range of not less than 0.1 V and not more than 10 V, an absolute value of a drain current per unit channel width, Ids/W1, falls in an electric current state of not less than $1 \times 10^{-11}$ A/μm according to the drain voltage.

In one embodiment, the first transistor and the second transistor are thin film transistors.

In one embodiment, an organic insulating film is not provided above the active layer of the first transistor.

In one embodiment, an organic insulating film is provided above the active layer of the second transistor, and the organic insulating film is not provided above the active layer of the first transistor.

Advantageous Effects of Invention

According to one embodiment of the present invention, in a semiconductor device including a memory transistor which utilizes transition from a semiconductor state to a resistor state and other transistors in which an oxide semiconductor film is used which is common among the memory transistor and the other transistors, it is possible to increase the writing speed of the memory transistor and suppress deterioration of the characteristics of the other transistors during writing in the memory transistor. Therefore, it is possible to increase the writing speed of the memory transistor while securing the reliability of the semiconductor device.

DESCRIPTION OF EMBODIMENTS

Figure 1:
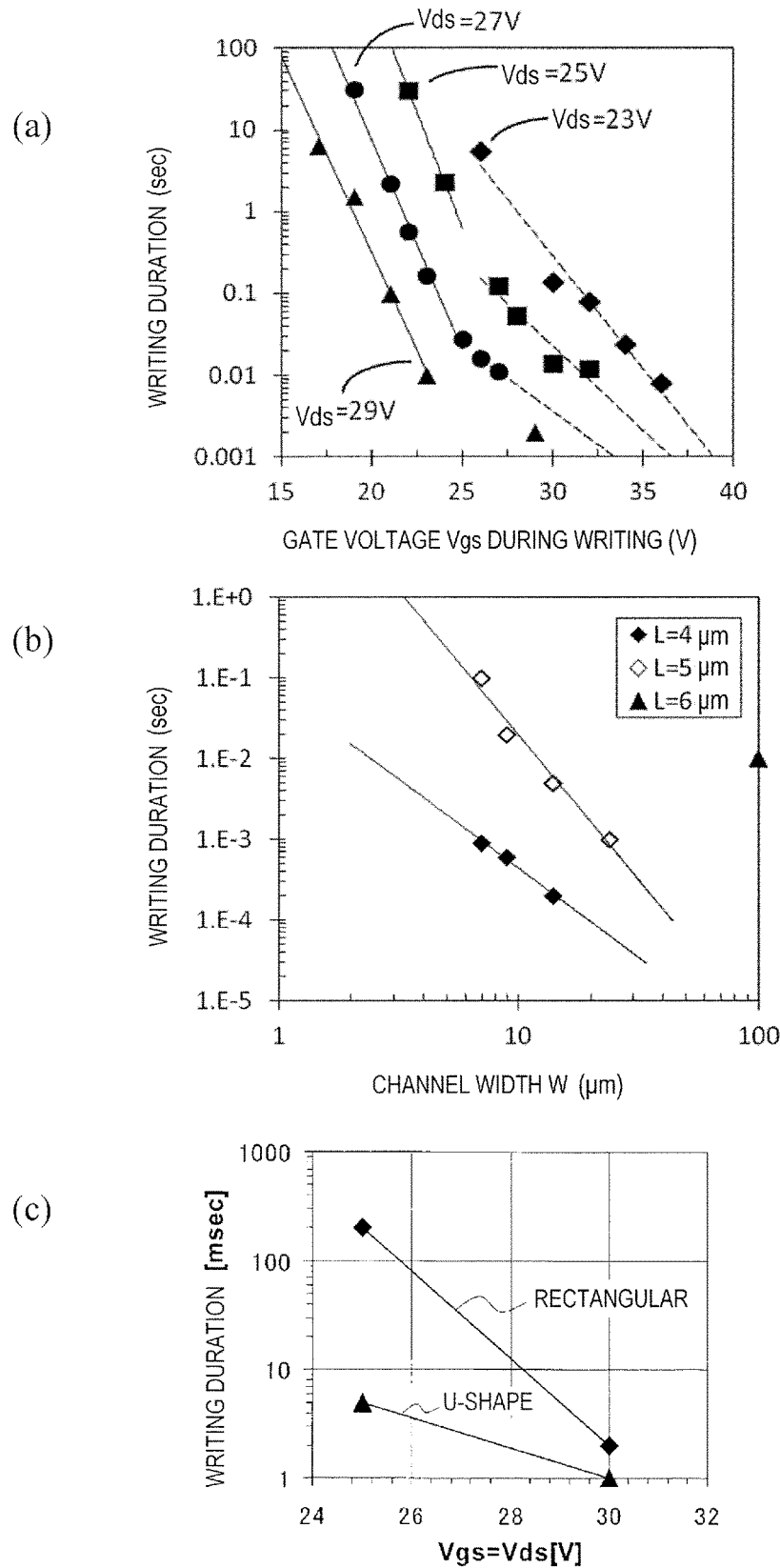
FIG. 1 (a) is a graph showing the relationship between writing voltage Vds and gate voltage Vgs of a memory transistor and the writing duration. (b) is a graph showing the relationship between the channel length and channel width of the memory transistor and the writing duration. (c) is a graph showing the relationship between the planar shape of a channel region and the writing duration.

The present inventors repeatedly carried out researches concerning a configuration of a semiconductor device including a memory transistor disclosed in Patent Document 3, which is capable of increasing the writing speed of the memory transistor while suppressing deterioration of the characteristics of the other transistors provided on the same substrate.

The present inventors first examined the relationship between the writing speed and the writing voltage of the memory transistor.

FIG. 1(a) is a graph showing the relationship between writing voltage Vds and gate voltage Vgs of the memory transistor and the writing duration. The horizontal axis represents gate voltage Vgs applied during writing. The vertical axis represents the writing duration. Note that gate voltage Vgs refers to a voltage between the gate and the source, and writing voltage Vds refers to a voltage applied between the source and the drain during writing. The "writing duration" refers to a duration which is required for a metal oxide semiconductor of the memory transistor to change into a resistor while predetermined gate voltage Vgs and writing voltage Vds are applied to the memory transistor such that a drain current (write current) flows.

It can be seen from the results shown in FIG. 1(a) that as writing voltage Vds increases, the writing duration is shorter, i.e., the writing speed increases. However, when other thin film transistors are formed on the same substrate as the memory transistor using an oxide semiconductor film which is common among the memory transistor and the thin film transistors, there is a probability that application of a high writing voltage Vds to the memory transistor causes a reaction of writing (decrease of the resistance in the channel region) in the other thin film transistors, leading to variation in the characteristics.

In view of such, the present inventors also carried out researches concerning a configuration which is capable of increasing the writing speed without greatly increasing the writing voltage. Note that the writing speed of the memory transistor does not simply depend on only the amount of Joule heat produced in the channel region during writing. Even when the amount of produced Joule heat is equal, the duration required for reducing the resistance of the channel region (writing duration) can be shortened by utilizing the Joule heat more efficiently.

FIG. 1(b) is a graph showing the relationship between channel length L and channel width W of the memory transistor and the writing duration in the case where gate voltage Vgs applied during writing and writing voltage Vds are constant (Vgs=30 V, Vds=30 V). The horizontal axis represents channel width W of the memory transistor. The vertical axis represents the writing duration.

It can be seen from the results shown in FIG. 1(b) that as channel length L decreases, the writing duration is shorter. This is probably because an electric current which flows between the source and the drain during writing (write current), Ipp, increases and the amount of produced Joule heat increases, and in addition, the Joule heat can be utilized more efficiently for change of the characteristics of the channel region.

It can also be seen that as channel width W increases, the writing duration is shorter. This is probably because the amount of produced Joule heat increases due to increased write current Ipp, and in addition, the temperature can be increased at central part of the channel region (central part in terms of the channel width direction), and at least a portion at the center of the channel region can be converted to a conductor more efficiently.

Here, from the viewpoint of suppressing the characteristic variation which occurs in the other thin film transistors due to writing in the memory transistor while increasing the writing speed of the memory transistor, it is preferred that a writing reaction in the memory transistor occurs with a shorter writing duration and a lower writing voltage. Meanwhile, it is preferred that a writing reaction in the other thin film transistors only occurs with a sufficiently long writing duration and a sufficiently high writing voltage as compared with the writing reaction in the memory transistor.

Examining the results shown in FIG. 1 from such a viewpoint, the following knowledge is obtained.

(1) When the channel length of the memory transistor is smaller than the channel length of the other thin film transistors, the writing speed of the memory transistor can be improved while variation in the characteristics of the other thin film transistors is suppressed.

(2) Even when the channel width of the memory transistor is greater than the channel width of the other thin film transistors, the same effect as that of (1) is obtained.

(3) More preferably, the ratio of the channel length to the channel width of the memory transistor is smaller than the ratio of the channel length to the channel width of the other thin film transistors. This enables to more surely suppress the variation in the characteristics of the other thin film transistors.

The results shown in FIGS. 1(a) and 1(b) were obtained by examination with the use of a memory transistor whose channel region was rectangular when viewed in a direction normal to the substrate. However, a similar tendency is shown even when the planar shape of the channel region is not rectangular.

The present inventors further found that the writing characteristics also vary depending on the device configuration of the memory transistor. For example, when the memory transistor has a configuration which readily produces Joule heat or a configuration in which the produced Joule heat is unlikely to diffuse, higher writing characteristics can be realized. In one example, the planar shape of the channel region is designed so as to more efficiently utilize the Joule heat, whereby the writing duration can be shortened.

FIG. 1(c) is a graph showing the relationship between the planar shape of the channel region and the writing duration. The horizontal axis represents gate voltage Vgs and writing voltage Vds (where Vgs=Vds). The vertical axis represents the writing duration. Here, a memory transistor in which the planar shape of the channel region is rectangular and a memory transistor in which the planar shape of the channel region is a U-shape were examined as to the writing duration. Note that the channel width and the channel length of these memory transistors are equal, and the dimensions other than the planar shape of the channel region (the thickness of the active layer, the material and thickness of the gate insulating film, etc.) are also equal.

It can be seen from the results shown in FIG. 1(c) that when the channel region has a U-shape, Joule heat produced from the write current can be more efficiently utilized for writing than in a case where the channel region has a rectangular shape. The reasons for this are as follows. In the case where the channel region has a U-shape, one of the drain electrode and the source electrode is surrounded by the other when viewed in a direction normal to the substrate. Thus, the current density is higher at the surrounded electrode so that produced Joule heat is greater than that produced at the other electrode. As a result, the resistance of the oxide semiconductor decreases due to the Joule heat, and the writing operation is enhanced. Note that the planar shape of the channel region is not limited to a U-shape. The same effects are produced so long as the channel region has such a shape that the current density locally increases.

Therefore, it is verified that, not only by setting the channel length and the channel width so as to meet the above-described conditions (1) to (3) but also by configuring the memory transistor and the other transistors so as to have different planar shapes of the channel regions, the writing speed of the memory transistor can be further increased while variation in the characteristics due to writing in the other transistors can be suppressed more efficiently. For example, in the case where the channel region of the memory transistor has a U-shape and the channel region of the other transistors has a rectangular shape when viewed in a direction normal to the substrate, the difference in writing duration between the memory transistor and the other transistors can be further increased, and greater effects are achieved.

The present inventors found, based on the foregoing knowledge, a configuration in which writing in the memory transistor is completed within a predetermined writing duration and the writing duration of the other transistors can be sufficiently long, and arrived at the present invention.

Hereinafter, embodiments of a semiconductor device according to the present invention are specifically described with reference to the drawings.

(First Embodiment)

The first embodiment of the semiconductor device according to the present invention includes the first thin film transistor and the second thin film transistor on the same substrate. The first thin film transistor is a memory transistor which functions as a memory device. The second thin film transistor is a transistor which does not function as a memory device but which is a constituent of a circuit. In this specification, such a transistor is referred to as "circuit constituent transistor" for distinction from the memory transistor.

FIG. 2(a) is a cross-sectional view showing a memory transistor (first thin film transistor) 10A and a circuit constituent transistor (second thin film transistor) 10B in a semiconductor device 1001 of the present embodiment. FIGS. 2(b) and 2(c) are plan views of the memory transistor 10A and the circuit constituent transistor 10B, respectively. FIG. 2(a) shows cross-sectional structures taken along line I-I' of FIG. 2(b) and line II-II' of FIG. 2(c).

The semiconductor device 1001 includes a substrate 1, the memory transistor 10A supported on the substrate 1, and the circuit constituent transistor 10B supported on the substrate 1. The circuit constituent transistor 10B only needs to be a circuit element which is a constituent of a circuit, and the use thereof is not particularly limited. These transistors 10A, 10B have active layers (oxide semiconductor layers) 7A, 7B which are formed from a common oxide semiconductor film.

The memory transistor 10A is a nonvolatile memory device which is capable of being irreversibly changed from a state where drain current Ids depends on gate voltage Vgs (referred to as "semiconductor state") to a state where drain current Ids does not depend on gate voltage Vgs (referred to as "resistor state"). Drain current Ids refers to an electric current which flows between the source and the drain of the memory transistor 10A. Gate voltage Vgs refers to a voltage between the gate and the source.

The above-described state change can be caused by, for example, applying a predetermined writing voltage Vds between the source and the drain of the memory transistor 10A which is in a semiconductor state (initial state). Application of the writing voltage Vds causes an electric current to flow through part of an active layer 7A in which a channel is to be formed (channel region 7cA), thereby producing Joule heat. Due to this Joule heat, the resistance of the channel region 7cA of the active layer 7A decreases. As a result, the memory transistor changes to a resistor state so that it does not depend on gate voltage Vgs but exhibits an ohmic resistance characteristic. Although the reasons for the decrease of the resistance of the oxide semiconductor are not yet elucidated, it is estimated that oxygen included in the oxide semiconductor diffuses out of the channel region 7cA due to the Joule heat, and the number of oxygen deficiencies inside the channel region 7cA increases so that carrier electrons are produced. Note that a memory transistor which is capable of such a state change is disclosed in Patent Document 3 of the present applicant and in Japanese Patent Applications Nos. 2012-137868 and 2012-231480 of the present applicant which are not yet laid open to public inspection. The entire disclosures of these are incorporated by reference in this specification.

In the present embodiment, channel length L1 of the memory transistor 10A is smaller than channel length L2 of the circuit constituent transistor 10B (L1<L2). Instead, or in addition, channel width W1 of the memory transistor 10A may be greater than channel width W2 of the circuit constituent transistor 10B (W1>W2).

In the semiconductor device 1001, the channel length or the channel width of the memory transistor 10A and the circuit constituent transistor 10B are set as described above. Thus, as previously described with reference to FIG. 1, the writing speed of the memory transistor 10A can be increased while variation in the characteristics of the circuit constituent transistor 10B is suppressed during writing in the memory transistor 10A.

More preferably, the ratio L1/W1 of the channel length to the channel width in the memory transistor, is smaller than the ratio L2/W2 of the channel length to the channel width in the circuit constituent transistor. Thus, variation in the characteristics of the circuit constituent transistor 10B which is attributed to a writing operation can be suppressed more surely.

Thus, according to the present embodiment, for example, even when the same voltage is applied to the memory transistor and to the other thin film transistors such that a drain current flows, it is possible that a writing operation is completed in the memory transistor and the memory transistor transitions to a resistor state while a writing operation in the other thin film transistors is not completed so that the other thin film transistors are maintained at the initial semiconductor state. If the drain current is shut off at the time when the writing operation in the memory transistor is completed, only the memory transistor can transition to a resistor state.

After the writing operation, the memory transistor 10A is in a semiconductor state or a resistor state. The semiconductor device 1001 may include a plurality of memory transistors 10A. In this case, the plurality of memory transistors 10A after the writing include a memory transistor which is in a semiconductor state and a memory transistor which is in a resistor state. Note that even when the plurality of memory transistors 10A are included, the channel length or the channel width of each of the memory transistors 10A is preferably set as described above.

Now, more specific configurations of the transistors 10A, 10B are described.

The memory transistor 10A includes an active layer 7A which is formed from an oxide semiconductor film, a gate electrode 3A, a gate insulating film 5 which is located between the active layer 7A and the gate electrode 3A, a source electrode 9sA which is arranged so as to be in contact with a part of the active layer 7A, and a drain electrode 9dA which is arranged so as to be in contact with another part of the active layer 7A. When viewed in a direction normal to the substrate 1, at least a portion of the active layer 7A is arranged so as to extend over the gate electrode 3A with the gate insulating film 5 interposed therebetween. Note that the active layer 7A may not be in direct contact with the source electrode 9sA or the drain electrode 9dA so long as the active layer 7A is electrically connected with the source electrode 9sA and the drain electrode 9dA. The part of the active layer 7A which is in contact with the source electrode 9sA (or the part of the active layer 7A which is electrically connected with the source electrode 9sA) is referred to as "source contact region". The part of the active layer 7A which is in contact with the drain electrode 9dA (or the part of the active layer 7A which is electrically connected with the drain electrode 9dA) is referred to as "drain contact region". When viewed in a direction normal to the substrate 1, a portion of the active layer 7A which extends over the gate electrode 3A with the gate insulating film 5 interposed therebetween and which is located between the source contact region and the drain contact region forms the channel region 7cA. In this specification, a length in a channel direction of the channel region 7cA is referred to as "channel length L1", and a length of the channel region 7cA in a direction perpendicular to the channel direction is referred to as "channel width W1".

In the present embodiment, the entire active layer 7A extends over the gate electrode 3A, and the active layer 7A is in direct contact with the source electrode 9sA and the drain electrode 9dA. In such a case, channel length L1 of the memory transistor 10A corresponds to a length in the channel direction of the gap between the source electrode 9sA and the drain electrode 9dA above the active layer 7A when viewed in a direction normal to the substrate 1. Channel width W1 corresponds to a length of the gap in a direction perpendicular to the channel direction.

In the illustrated example, when viewed in a direction normal to the substrate 1, one of the drain electrode 9dA and the source electrode 9sA (here, the drain electrode 9dA) has a recess above the active layer 7A. The other electrode (here, the source electrode 9sA) is provided in the recess of the drain electrode 9dA so as to be spaced away from the drain electrode 9dA. Therefore, the channel region 7cA which is located between the source electrode 9sA and the drain electrode 9dA has a U-shape. In such a case, as shown in FIG. 2(b), the width of the gap between the source electrode 9sA and the drain electrode 9dA is channel length L1. The length of a line in the channel region 7cA on which the distance from the source electrode 9sA and the distance from the drain electrode 9dA are equal to each other (the length of a line formed by midpoints of the distance between the source electrode 9sA and the drain electrode 9dA above the active layer 7A) is channel width W1.

The circuit constituent transistor 10B includes an active layer 7B formed from an oxide semiconductor film which is common among the active layer 7A and the active layer 7B, a gate electrode 3B, a gate insulating film 5 which is located between the active layer 7B and the gate electrode 3B, a source electrode 9sB which is arranged so as to be in contact with a part of the active layer 7B, and a drain electrode 9dB which is arranged so as to be in contact with another part of the active layer 7A. When viewed in a direction normal to the substrate 1, the gate electrode 3B is arranged so as to extend over at least a portion of the active layer 7B. As in the above-described memory transistor 10A, the active layer 7B includes a source contact region which is in contact with (or electrically connected with) the source electrode 9sB, a drain contact region which is in contact with (or electrically connected with) the drain electrode 9dB, and a channel region 7cB. When viewed in a direction normal to the substrate 1, the channel region 7cB is a region which extends over the gate electrode 3B with the gate insulating film 5 interposed therebetween and which is located between the source contact region and the drain contact region of the active layer 7B. In the illustrated example, channel length L2 of the circuit constituent transistor 10B is a length in the channel direction of the gap between the source electrode 9sB and the drain electrode 9dB above the active layer 7B, and channel width W2 is a length of the gap in a direction perpendicular to the channel direction.

In the present embodiment, the channel region 7cA of the memory transistor 10A has a U-shape, and the channel region 7cB of the circuit constituent transistor 10B has a rectangular shape. Therefore, in the memory transistor 10A, Joule heat produced by a write current can be more efficiently utilized in decreasing the resistance of the channel region 7cA (writing). Further, channel width W1 can be increased without increasing the size of the active layer 7A. Therefore, the difference in writing speed between the memory transistor 10A and the circuit constituent transistor 10B can be further increased. Thus, variation in the characteristics of the circuit constituent transistor 10B which is attributed to writing in the memory transistor 10A can be suppressed more surely.

In the present embodiment, the gate electrodes 3A, 3B of the memory transistor 10A and the circuit constituent transistor 10B are formed from a common electrically-conductive film for the gate. The gate insulating film 5 of the memory transistor 10A extends up to the circuit constituent transistor 10B and also functions as a gate insulating film of the circuit constituent transistor 10B. The source electrodes 9sA, 9sB and the drain electrodes 9dA, 9dB of the memory transistor 10A and the circuit constituent transistor 10B are formed from a common electrically-conductive film for the source. Thus, the circuit constituent transistor 10B and the memory transistor 10A can be formed through a common process, and accordingly, the number of manufacturing steps can be reduced.

Figure 2:
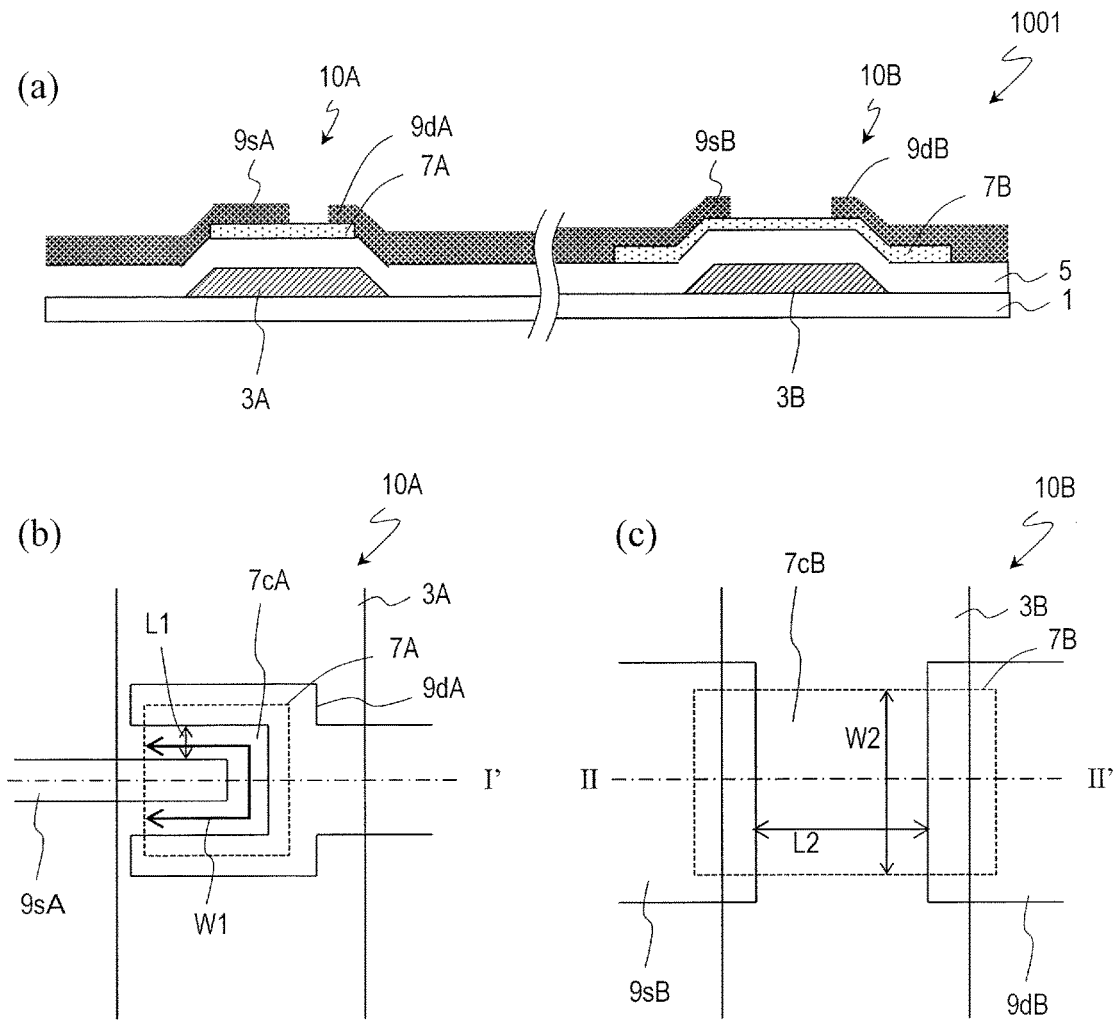
FIG. 2 (a) is a cross-sectional view showing a memory transistor 10A and a circuit constituent transistor 10B in a semiconductor device 1001 of the first embodiment. (b) and (c) are plan views of the memory transistor 10A and the circuit constituent transistor 10B, respectively.

Note that the planar shape of the channel region 7cA of the memory transistor 10A may be rectangular although it is a U-shape in the example illustrated in FIG. 2. Likewise, the planar shape of the channel region 7cB of the circuit constituent transistor 10B may be a U-shape although it is rectangular in the illustrated example. The memory transistor 10A and the circuit constituent transistor 10B are not limited to a bottom gate configuration but may have a top gate configuration. Note that, however, if the memory transistor 10A and the circuit constituent transistor 10B have the same configuration, these transistors 10A, 10B can be formed through a common process.

The oxide semiconductor film that forms the active layers 7A, 7B of the memory transistor 10A and the circuit constituent transistor 10B is, for example, an In—Ga—Zn—O based semiconductor film. Here, the In—Ga—Zn—O based semiconductor is a ternary oxide consisting of In (indium), Ga (gallium) and Zn (zinc). The proportion (composition ratio) of In, Ga and Zn is not particularly limited but includes, for example, In:Ga:Zn=2:2:1, In:Ga:Zn=1:1:1, and In:Ga:Zn=1:1:2. In the present embodiment, the active layers 7A, 7B may be an In—Ga—Zn—O based semiconductor layer which includes In, Ga and Zn in a proportion of In:Ga:Zn=1:1:1, for example.

A TFT which includes an In—Ga—Zn—O based semiconductor layer has high mobility (20 times or more as compared with an a-Si TFT) and low current leakage (less than 1/100 as compared with an a-Si TFT). When a TFT which includes an In—Ga—Zn—O based semiconductor layer is used, the power consumption of a display device can be greatly reduced.

The In—Ga—Zn—O based semiconductor may be amorphous or may include a crystalline portion. As the crystalline In—Ga—Zn—O based semiconductor, a crystalline In—Ga—Zn—O based semiconductor in which the c-axis is oriented generally perpendicular to the layer surface may be used. The crystalline structure of such an In—Ga—Zn—O based semiconductor is disclosed in, for example, Japanese Laid-Open Patent Publication No. 2012-134475. The entire disclosure of Japanese Laid-Open Patent Publication No. 2012-134475 is incorporated by reference in this specification.

As the oxide semiconductor film, a different semiconductor film in which decrease of the resistance due to Joule heat can occur may be used instead of the In—Ga—Zn—O based semiconductor. For example, a semiconductor film which includes, for example, NiO, $SnO_2$, $TiO_2$, $VO_2$, $In_2O_3$, or $SrTiO_3$ may be used. Alternatively, a Zn—O based semiconductor (ZnO), an In—Zn—O based semiconductor (IZO (registered trademark)), a Zn—Ti—O based semiconductor (ZTO), a Cd—Ge—O based semiconductor, a Cd—Pb—O based semiconductor, a CdO (cadmium oxide), a Mg—Zn—O based semiconductor, an In—Sn—Zn—O based semiconductor (e.g., $In_2O_3$—$SnO_2$—ZnO), an In—Ga—Sn—O based semiconductor, or the like, may be used. Still alternatively, a film obtained by adding various impurities to these oxide semiconductors may be used.

<Operation of Memory Transistor 10A>

The memory transistor 10A can be used in a memory circuit which is capable of storing information in a nonvolatile fashion with the semiconductor state (initial state) assigned to logical value "0" and the resistor state assigned to logical value "1", for example. Hereinafter, a configuration and an operation example of a memory circuit in which the memory transistor 10A is used are described. The memory circuit includes one or a plurality of memory cells.

Figure 3:
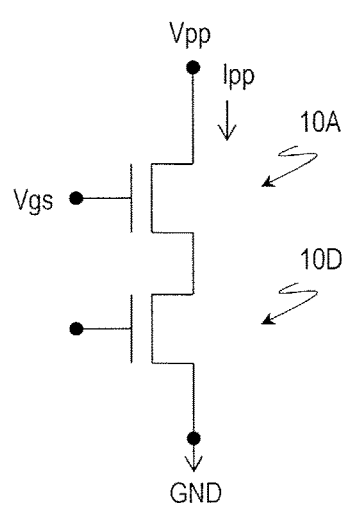
FIG. 3 A diagram illustrating a single memory cell which is a constituent of a memory circuit of the first embodiment.

FIG. 3 is a diagram illustrating a single memory cell which is a constituent of the memory circuit. The memory cell includes, for example, a memory transistor 10A and a transistor for memory cell selection ("select transistor") 10D which is connected in series with the memory transistor 10A. The memory circuit has a configuration in which a plurality of memory cells are arranged in a matrix, for example.

The configuration of the select transistor 10D is not particularly limited but may include an active layer which is formed from the same oxide semiconductor film as the active layer of the memory transistor 10A. Accordingly, the memory transistor 10A and the select transistor 10D can be manufactured simply and conveniently through a common process. In such a case, the circuit constituent transistor 10B shown in FIG. 2 may be, for example, the select transistor 10D.

In the memory cell shown in FIG. 3, by applying a gate voltage to the select transistor 10D such that the select transistor 10D transitions to an ON state, a writing or reading operation in/from the memory transistor 10A is enabled.

Writing in the memory transistor 10A can be realized by applying a predetermined gate voltage Vg to the gate electrode of the memory transistor 10A while a predetermined writing voltage Vpp to the drain electrode in a period (writing duration) Tpp. During this period, the source electrode of the select transistor 10D is kept connected to a fixed voltage (e.g., ground potential). As a result, during the period Tpp, write current Ipp flows through the channel region of the memory transistor 10A. Joule heat produced by write current Ipp changes the chemical composition ratio of the oxide semiconductor which forms the channel region, so that the channel region has a decreased resistance, i.e., changes into a resistor state.

Reading from the memory transistor 10A can be realized by measuring the gate voltage dependence of an electric current which flows when a predetermined voltage is applied between the source and the drain of the memory transistor 10A (read current). Specifically, it can be readily determined from the ratio of read current Ir during reading to current It where It is a read current which flows through the memory transistor 10A when the memory transistor 10A is in a semiconductor state. Note that if gate voltage Vgs applied during reading is set within a predetermined voltage range (e.g., about 0.5 V or lower), the difference between read current It and read current Ir is large, and therefore, the state of the memory transistor 10A can be determined more easily.

<Configuration of Semiconductor Device>

The present embodiment is applicable to a wide variety of electronic devices which include a memory circuit. A semiconductor device of the present embodiment only needs to include at least one memory transistor 10A and at least one circuit constituent transistor 10B and is not limited to particular uses or configurations. For example, it may be a nonvolatile semiconductor storage device, an integrated circuit (IC, LSI), various display devices, such as liquid crystal display devices and organic EL display devices, or an active matrix substrate for use in various display devices.

When the present embodiment is applied to an electronic device which has a plurality of power supply domain regions on the same substrate, the circuit constituent transistor 10B may be a thin film transistor provided in a power supply domain region which includes the memory transistor 10A. Here, the "power supply domain regions" refer to regions to which equal voltages are to be applied.

Note that, in the above-described power supply domain regions, a plurality of thin film transistors may be formed as circuit elements, which include an active layer formed from an oxide semiconductor film that is common among the active layer of the memory transistor 10A and the thin film transistors. In that case, channel length L1 of the memory transistor 10A may be not more than the smallest value of the channel lengths of the above-described plurality of thin film transistors. More preferably, it is less than the smallest value. Thus, when a writing voltage is applied to the memory transistor 10A, variation in the characteristics of all the transistors to which equal voltages can be applied can be suppressed more effectively. If the ratio L1/W1 of the channel length to the channel width of the memory transistor 10A, is not more than (more preferably, less than) the smallest value of the ratios of the channel length to the channel width of the above-described plurality of thin film transistors, greater effects can be obtained.

When the present embodiment is applied to an active matrix substrate of a display device, a memory circuit including the memory transistor 10A may be provided in a region of the active matrix substrate other than the display region (peripheral region). In this case, the circuit constituent transistor 10B may be a circuit constituent transistor which is a constituent of a peripheral circuit, such as a driving circuit, provided in the peripheral region.

In the peripheral region, a plurality of thin film transistors may be formed as circuit elements, which include an active layer formed from an oxide semiconductor film that is common among the active layer of the memory transistor 10A and the thin film transistors. In that case, channel length L1 of the memory transistor 10A may be not more than, preferably less than, the smallest value of the channel lengths of the above-described plurality of thin film transistors. Thus, when a writing voltage is applied to the memory transistor 10A, variation in the characteristics of all the transistors in the peripheral region can be suppressed more effectively. If the ratio L1/W1 of the channel length to the channel width of the memory transistor 10A, is not more preferably less than, the smallest value of the ratios of the channel length to the channel width of the above-described plurality of thin film transistors, greater effects can be obtained.

Hereinafter, a more specific configuration of a semiconductor device of the present embodiment is described with reference to the drawings.

<1. Configuration of Active Matrix Substrate>

The present embodiment can be applied to, for example, an active matrix substrate for use in a liquid crystal display device.

FIG. 4(a) is a plan view showing part of an active matrix substrate 1002. The active matrix substrate 1002 includes a display region 100 including a plurality of pixels 101 and a region other than the display region (peripheral region 200).

In each of the pixels 101 of the display region 100, a thin film transistor (referred to as "pixel transistor") 10C is provided as a switching element. Although not shown, at least some of a plurality of circuits which are constituents of the display device (memory circuits and driving circuits) are monolithically formed in the peripheral region 200. The circuits formed in the peripheral region 200 are referred to as "peripheral circuits".

In the present embodiment, the memory transistor 10A is used in, for example, a memory circuit provided in the peripheral region 200. The circuit constituent transistor 10B is a thin film transistor which is a constituent of any of the peripheral circuits, for example, a driving circuit. Note that the circuit constituent transistor 10B may be a pixel transistor 10C provided in each pixel.

In each pixel 101, a source wire S extending in a column direction of the pixels, a gate wire G extending in a row direction of the pixels, and a pixel electrode 19 are provided. The pixel transistor 10C is provided near the intersection of the source wire S and the gate wire G. In the illustrated example, a capacitance wire CS which is formed from the same electrically-conductive film as the gate wire G is provided in the pixel 101. On the capacitance wire CS, a capacitance portion 20 is provided.

In the peripheral region 200, a plurality of terminal portions 201 are provided for connecting the gate wire G or the source wire S to an external wire. The source wire S extends up to an edge of the display region 100 and is connected with a source connecting portion 9sg. The source connecting portion 9sg is electrically connected with a gate connecting portion 3sg which is formed from the same film as the gate wire G. This connecting portion is referred to as "source-gate connecting portion" 30. The gate connecting portion 3sg extends up to the peripheral region 200 and is connected with, for example, a source driver (not shown) via a terminal portion (source terminal) 201. Meanwhile, although not shown, the gate wire G also extends up to the peripheral region 200 and is connected with, for example, a gate driver (not shown) via a terminal portion (gate terminal).

In the peripheral region 200, a plurality of peripheral circuits (not shown) which include a memory circuit are monolithically formed. For example, driving circuits, such as gate drivers and source drivers, and memory circuits connected with respective driver circuits may be formed. The memory circuit includes the memory transistor 10A shown in FIG. 2. The memory circuit or other peripheral circuits include the circuit constituent transistor 10B shown in FIG. 2. The memory transistor 10A and the circuit constituent transistor 10B formed in the peripheral region 200 and the pixel transistor 10C formed in the display region 100 may have an active layer which is formed from a common oxide semiconductor film. In this case, these transistors 10A to 10C can be manufactured through a common process.

The active matrix substrate 1002 is applicable to a display device such as a liquid crystal display device. The liquid crystal display device includes, for example, an active matrix substrate 1002, a counter substrate 41 which has a counter electrode 42 on the surface, and a liquid crystal layer 43 provided between the active matrix substrate 1002 and the counter substrate 41 as shown in FIG. 4(b). A voltage is applied to the liquid crystal layer 43 at each pixel by the pixel electrode 19 and the counter electrode 42, whereby display is performed.

Figure 5:
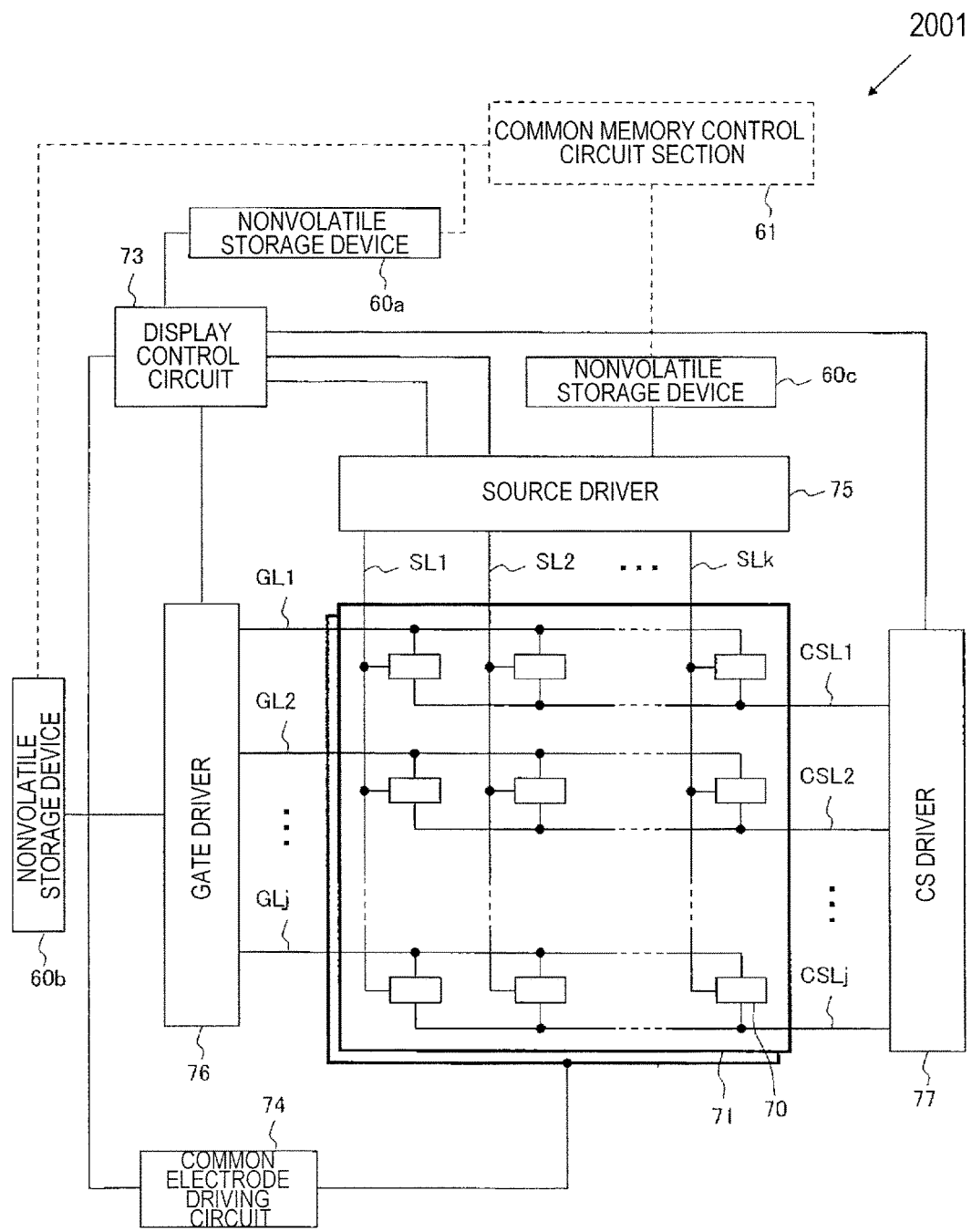
FIG. 5 A diagram illustrating a block configuration of the liquid crystal display device 2001.

FIG. 5 is a diagram illustrating a block configuration of a liquid crystal display device 2001 in which the active matrix substrate 1002 is used. FIGS. 6(a) to 6(d) are general schematic diagrams showing a memory cell which is a constituent of nonvolatile storage devices 60a to 60c, a pixel circuit of the liquid crystal display device 2001, a gate driver 76, and the configuration of a single stage of the gate driver 76, respectively.

The liquid crystal display device 2001 has a display section 71 which includes a plurality of pixels. The display section 71 corresponds to the display region 100 of the active matrix substrate 1002 (FIG. 4(a)). In the present embodiment, a plurality of pixel circuits 70 are arranged in a matrix in the display section 71. These pixel circuits 70 are connected with one another via source lines SL1 to SLk, gate lines GL1 to GLj, and storage capacitance lines CSL1 to CSLj.

Figure 6:
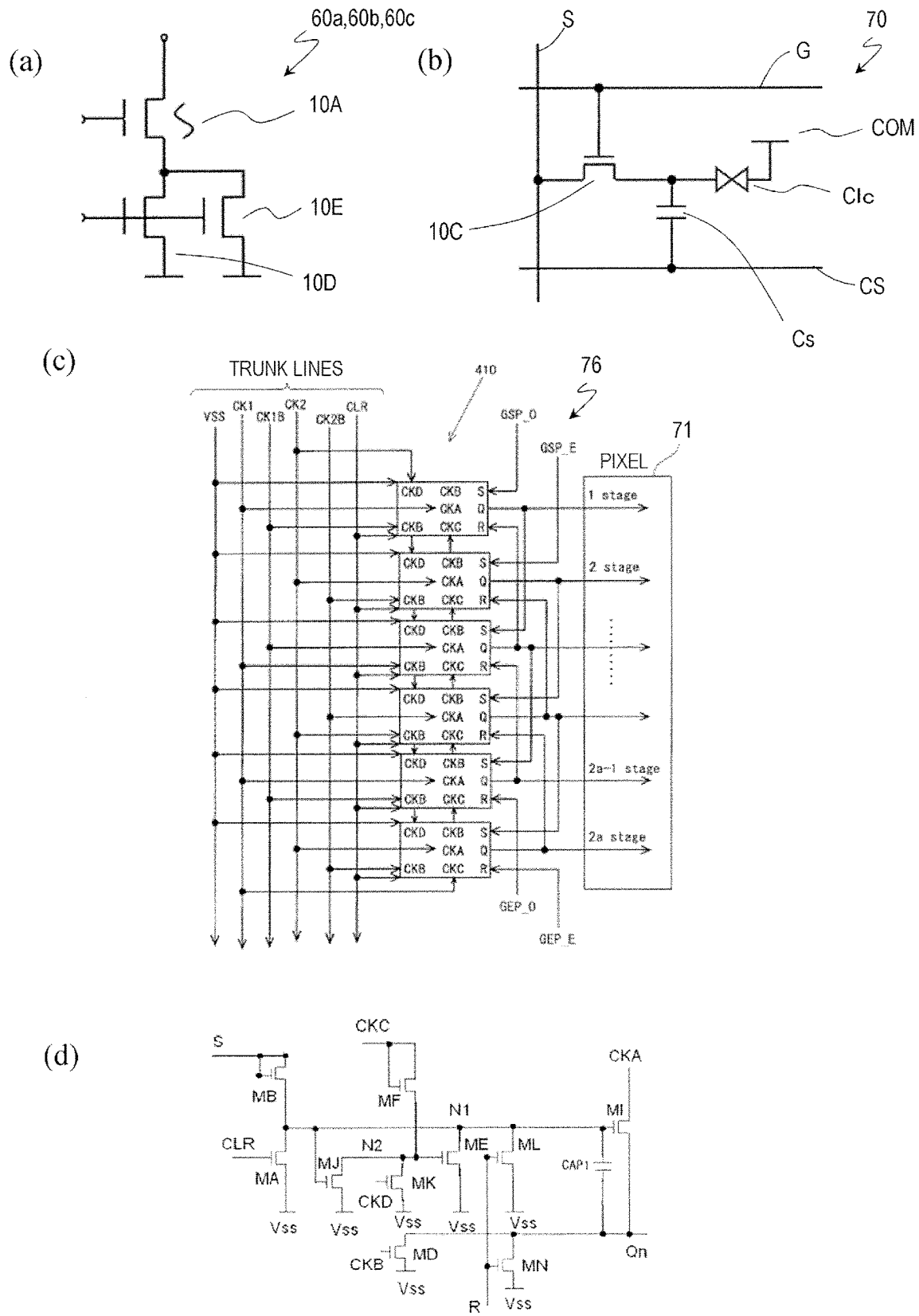
FIG. 6 (a) to (d) are general schematic diagrams showing a memory cell which is a constituent of nonvolatile storage devices 60a to 60c, a pixel circuit of the liquid crystal display device 2001, a gate driver 76, and the configuration of a single stage of the gate driver 76, respectively.
Figure 7:
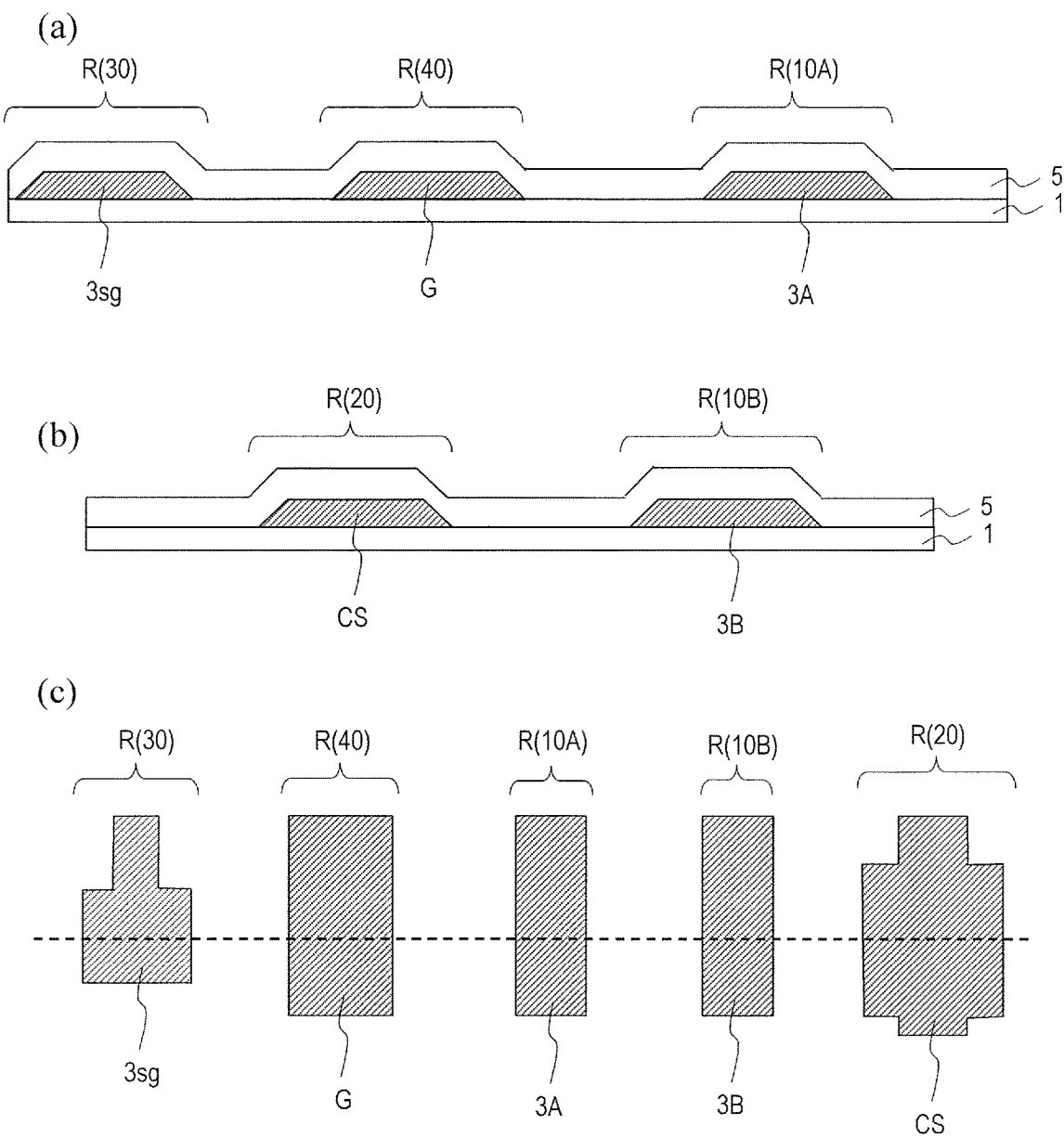
FIG. 7 Process diagrams for illustrating a manufacturing method of a semiconductor device (active matrix substrate 1002) of the first embodiment. (a) and (b) are cross-sectional views. (c) is a top view.
Figure 8:
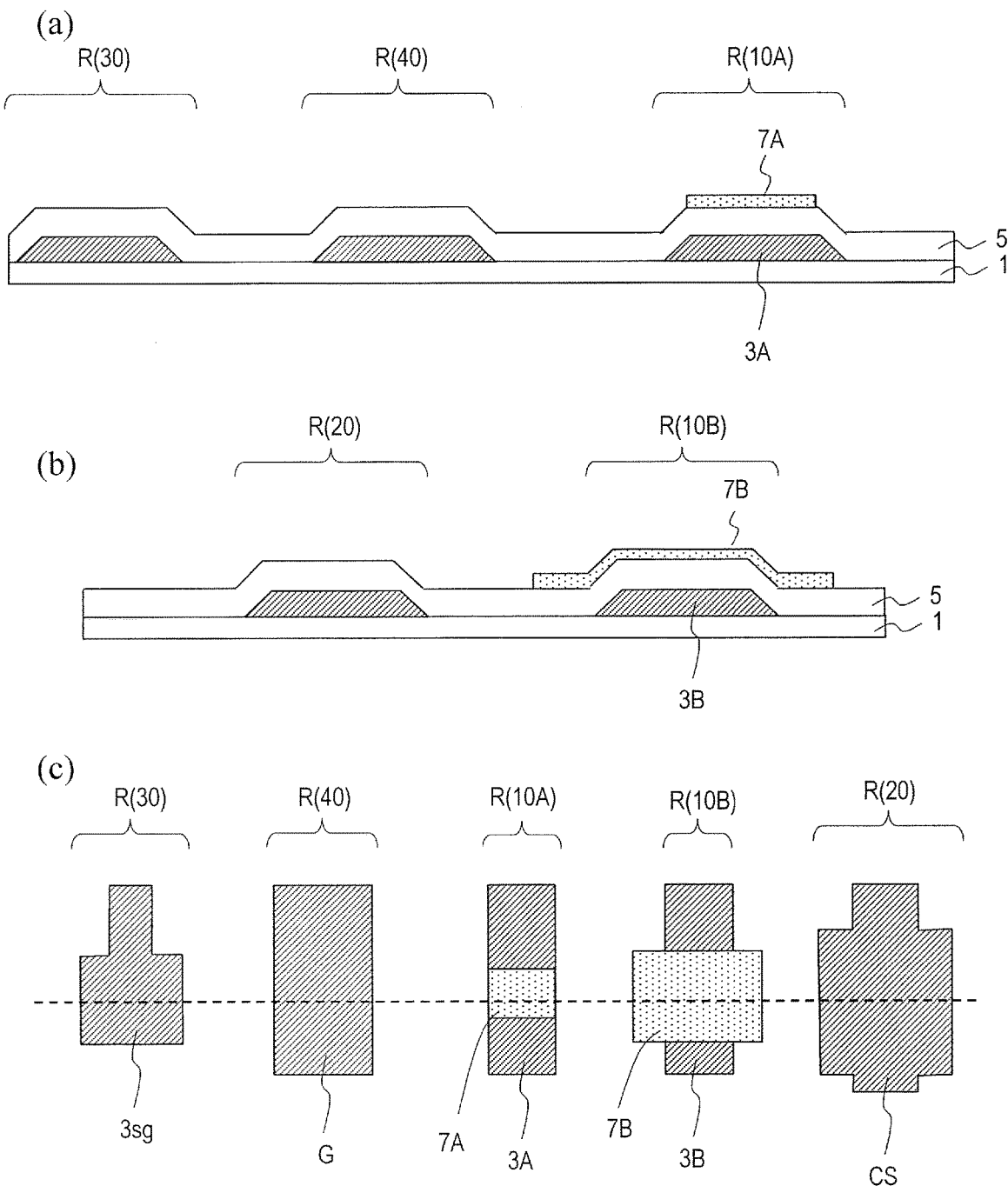
FIG. 8 Process diagrams for illustrating a manufacturing method of a semiconductor device (active matrix substrate 1002) of the first embodiment. (a) and (b) are cross-sectional views. (c) is a top view.
Figure 9:
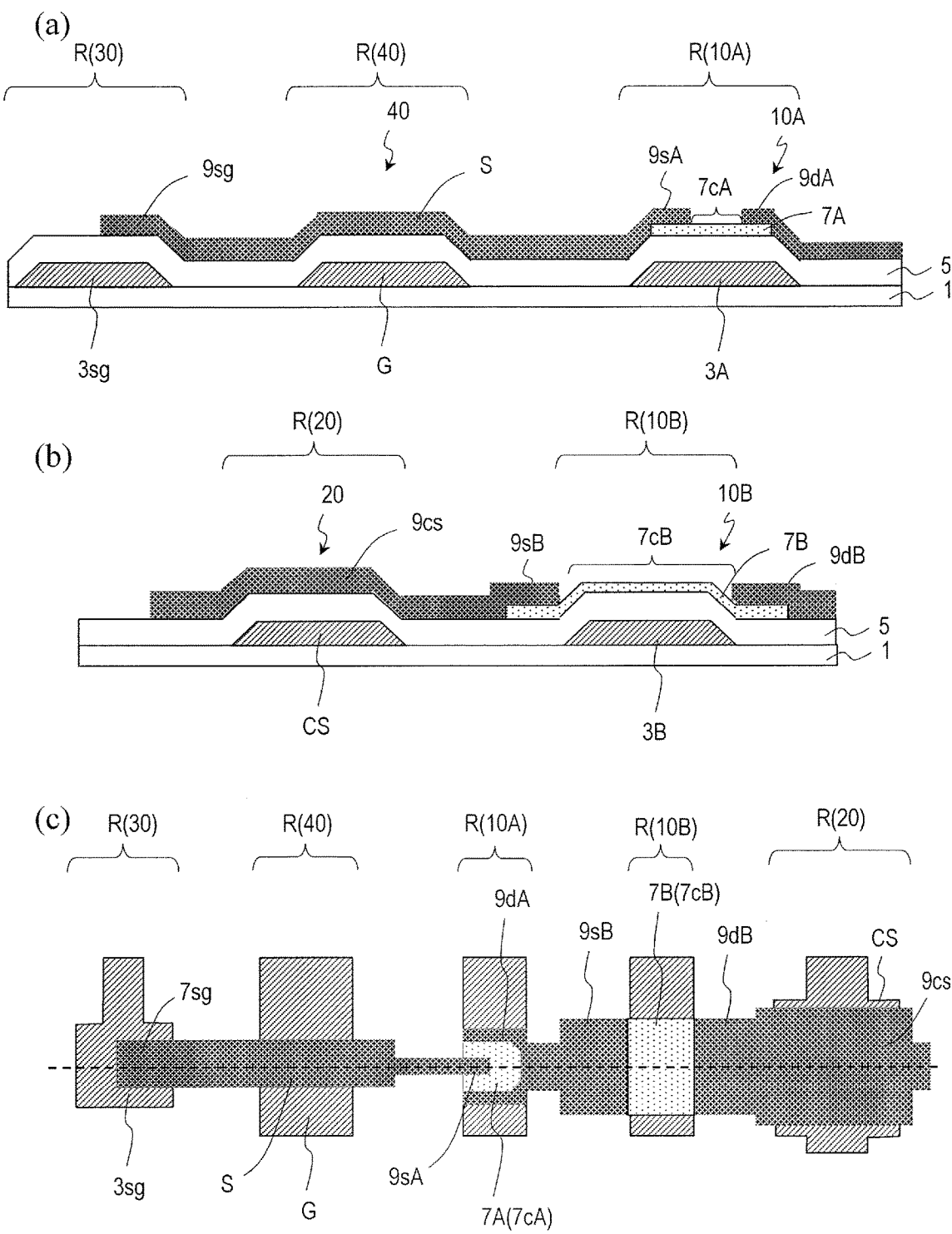
FIG. 9 Process diagrams for illustrating a manufacturing method of a semiconductor device (active matrix substrate 1002) of the first embodiment. (a) and (b) are cross-sectional views. (c) is a top view.

Each of the pixel circuits 70 includes a pixel transistor 10C, a liquid crystal capacitance Clc, and a storage capacitance Cs as shown in FIG. 6(b). The source electrode of the pixel transistor 10C is connected with the source wire S, the gate electrode is connected with the gate wire G, and the drain electrode is connected with a pixel electrode (not shown). The pixel electrode and a common electrode COM form the liquid crystal capacitance Clc. The pixel electrode and the capacitance wire CS form the storage capacitance Cs.

The liquid crystal display device 2001 further includes a source driver 75 electrically connected with the source wire S, a gate driver 76 electrically connected with the gate wire G, a CS driver 77 electrically connected with the capacitance wire CS, and a common electrode driving circuit 74 for driving the common electrode. These driving circuits 75, 76, 77, 74 are connected with a display control circuit 73 for controlling timings and voltages applied to the source wire S, the gate wire G, the capacitance wire CS and the common electrode, and with a power supply circuit (not shown) for supplying electric power to these circuits. The source driver 75, the gate driver 76 and the display control circuit 73 are connected with nonvolatile storage devices 60a, 60b, 60c. The nonvolatile storage devices 60a, 60b, 60c are connected with a common memory control circuit section 61.

The nonvolatile storage devices 60a, 60b, 60c have a configuration where, for example, a plurality of memory cells are arranged in an array. The memory cells include memory transistors 10A. The memory cells may have the configuration previously described with reference to FIG. 3. Alternatively, as illustrated in FIG. 6(a), the memory cells may have two or more select transistors 10D, 10E that are connected in parallel instead of the select transistor 10D shown in FIG. 3.

In the nonvolatile storage device 60a, the configuration information and the unique ID and relevant data of the display panel are stored. These information stored in the nonvolatile storage device 60a are retrieved by the display control circuit 73. Based on these information, the display control circuit 73 carries out switching of the specific display control mode or optimization of control parameters. The unique ID and relevant data can be inquired from the system side connected with the display panel and are utilized for identification of the display panel and selection of an optimum driving mode. The display control circuit 73 switches a circuit which is to be used for display control based on the information stored in the nonvolatile storage device 60a, thereby realizing the optimum display control for the display.

In the nonvolatile storage device 60b, information about configuration parameters which are necessary for driving of the gate driver, such as redundancy relief information for the gate driver, are stored. Likewise, in the nonvolatile storage device 60c, information about configuration parameters which are necessary for driving of the source driver, such as redundancy relief information for the source driver, are stored.

At least part of the nonvolatile storage devices 60a, 60b, 60c and at least part of circuits 73, 74, 75, 76, 77, 61 provided in the other sections than the display section 71 are monolithically formed in the peripheral region 200 of the active matrix substrate 1002 (FIG. 4(a)).

In the present embodiment, for example, the gate driver 76 is monolithically formed in the active matrix substrate. The gate driver 76 is made up of, for example, a shift register 410 which has a plurality of stages as shown in FIG. 6(c). In the case where the display section 71 has a pixel matrix of i rows×j columns, the gate driver 76 includes a bistable circuit of i stages so as to correspond to respective rows of the pixel matrix in a one-to-one manner.

The bistable circuit included in the shift register 410 (the structure of one stage of the shift register 410) includes ten thin film transistors MA, MB, MI, MF, MJ, MK, ME, ML, MN and MD and a capacitor CAP1 as shown in FIG. 6(d). This bistable circuit also has an input terminal for receiving the first clock CKA, an input terminal for receiving the second clock CKB, an input terminal for receiving the third clock CKC, an input terminal for receiving the fourth clock CKD, an input terminal for receiving set signal S, an input terminal for receiving reset signal R, an input terminal for receiving clear signal CLR, and an output terminal for outputting state signal Q.

In the present embodiment, for example, the plurality of thin film transistors included in the bistable circuit shown in FIG. 6(d) and the memory transistor 10A included in any of the nonvolatile storage devices 60a to 60c have an active layer formed from a common oxide semiconductor film. At least one of, preferably all of, the thin film transistors included in the bistable circuit corresponds to the circuit constituent transistor 10B shown in FIG. 2. The channel length (or channel length/channel width) of the memory transistor 10A may be not more than, preferably less than, the smallest value of the channel lengths (or channel length/channel width) of the plurality of thin film transistors included in the bistable circuit shown in FIG. 6(d) and the pixel transistor 10C.

Note that, although the gate driver 76 has been described as an example in this section, the same applies to a case where any other circuit which includes thin film transistors is monolithically formed. Detailed circuit configurations of the display control circuit 73, the common electrode driving circuit 74, the source driver 75 and the CS driver 77 are generally equal to the configurations of known liquid crystal display devices, and thus, detailed description thereof is omitted herein.

In the present embodiment, it is only necessary that at least one of thin film transistors that are constituent of a monolithically-formed circuit corresponds to the circuit constituent transistor 10B previously described with reference to FIG. 2. Preferably, on the active matrix substrate 1002, in all the circuits provided in the same power supply domain region as a circuit which includes the memory transistor 10A (in circuits which are connected with the same power supply circuit), all of thin film transistors which function as circuit elements correspond to the circuit constituent transistor 10B. The pixel transistor 10C may also be the circuit constituent transistor 10B. Note that part of the above-described circuit may be provided on a different substrate which is externally connected with the active matrix substrate 1002.

Next, an example of a manufacturing method of the active matrix substrate 1002 is described with reference to the drawings.

FIG. 7 to FIG. 10 are process diagrams for illustrating the manufacturing method of the active matrix substrate 1002. In respective drawings, (a) and (b) are cross-sectional views, and (c) is a top view. In these diagrams, a region of the active matrix substrate 1002 in which the memory transistor 10A is to be formed, R(10A), a region in which the circuit constituent transistor 10B is to be formed, R(10B), a region in which the capacitance portion 20 is to be formed, R(20), a region in which a gate-source contact portion 30 is to be formed, R(30), and a region in which a gate-source intersection 40 is to be formed, R(40), are shown. The gate-source intersection 40 refers to a portion where an electrically-conductive layer formed from a gate wire or an electrically-conductive film which is the same as the gate wire and an electrically-conductive layer formed from a source wire or an electrically-conductive film which is the same as the source wire intersect each other with an insulating layer interposed therebetween. Note that, in these drawings, for the sake of convenience, the regions in which the transistors 10A, 10B and the capacitance portion 20 are to be formed are shown side by side, although the arrangement of these formation regions are not limited to the illustrated arrangement.

First, an electrically-conductive film for the gate is formed on the substrate 1 by sputtering, for example, and then patterned by a known dry etching method. Thereby, a gate connecting portion 3sg is formed in the gate-source contact portion formation region R(30), a gate wire G is formed in the gate-source intersection formation region R(40), a gate electrode 3A is formed in the memory transistor formation region R(10A), a capacitance wire CS is formed in the capacitance portion formation region R(20), and a gate electrode 3B is formed in the circuit constituent transistor formation region R(10B) as shown in FIG. 7(a) to FIG. 7(c). A layer which includes these wires and electrodes formed from the electrically-conductive film for the gate is referred to as "gate wire layer".

As the substrate 1, a transparent insulative substrate, such as a glass substrate, for example, can be used. As the electrically-conductive film for the gate, for example, a single layer film of aluminum (Al), chromium (Cr), copper (Cu), tantalum (Ta), titanium (Ti), molybdenum (Mo), or tungsten (W), a multilayer film consisting of two or more layers of these elements, or an alloy film including two or more of the above-described metal elements as constituents may be used. For example, a three-layer film which includes a Ti film, an Al film, and a Ti film in this order from the substrate 1 side (Ti/Al/Ti), or a three-layer film which includes a Mo film, an Al film, and a Mo film in this order (Mo/Ti/Mo), may be used. In the present embodiment, as an example, a three-layer film which includes a 10-100 nm thick Ti film, a 50-500 nm thick Al film, and a 50-300 nm thick Ti film in this order from the substrate 1 (Ti/Al/Ti) is used.

Thereafter, a gate insulating film 5 is formed so as to cover the gate wire layer. The gate insulating film 5 is formed by, for example, plasma CVD or sputtering. As the gate insulating film 5, for example, a single layer film, or a multilayer film consisting of two or more layers, selected from a silicon oxide film ($SiO_2$), a silicon nitride film (SiN), a silicon nitroxide film (SiNO), a silicon oxynitride film (SiON), aluminum oxide ($Al_2O_3$), and tantalum oxide ($Ta_2O_5$) may be used. In the present embodiment, as an example, a two-layer film is used which includes a 100-500 nm thick SiN film and a 20-100 nm thick $SiO_2$ film from the substrate 1 side.

Then, an oxide semiconductor film (thickness: for example, 20-200 nm) is formed on the gate insulating film 5 by, for example, sputtering. Thereafter, the oxide semiconductor film is patterned by a known wet etching method. Thereby, an active layer 7A is formed in the memory transistor formation region R(10A), and an active layer 7B is formed in the circuit constituent transistor formation region R(10B) as shown in FIG. 8(a) to FIG. 8(c). The active layers 7A, 7B are arranged so as to extend over the corresponding gate electrodes 3A, 3B, respectively, with the gate insulating film 5 interposed therebetween. Here, the gate electrodes 3A, 3B have generally equal widths in the channel direction, and the width in the channel direction of the active layer 7A is smaller than the width in the channel direction of the active layer 7B. For example, as illustrated, it is possible that the width in the channel direction of the active layer 7A is smaller than the width in the channel direction of the gate electrode 3A while the width in the channel direction of the active layer 7B is greater than the width in the channel direction of the gate electrode 3B. Such a configuration enables to realize transistor structures of different channel lengths without increasing the parasitic capacitance formed at a portion where the gate electrodes 3A, 3B and the source and drain electrodes overlap each other.

As the oxide semiconductor film, an oxide semiconductor film which includes, for example, In, Ga and Zn can be used. In the present embodiment, an In—Ga—Zn—O based amorphous oxide semiconductor film (thickness: for example, 20-200 nm) is used. This semiconductor film is a n-type metal oxide semiconductor and is formed at a low temperature. The composition ratio of respective metal elements in the In—Ga—Zn—O based oxide semiconductor film, In:Ga:Zn, is 1:1:1, for example. Even if the composition ratio is modified based on this composition ratio, the effects of the present invention are provided.

Then, an electrically-conductive film for the source is formed on the gate insulating film 5 and the active layers 7A, 7B by, for example, sputtering. The electrically-conductive film for the source is patterned by a known dry etching method. Thereby, a source connecting portion 9sg is formed in the gate-source contact portion formation region R(30), a source wire S is formed in the gate-source intersection formation region R(40), a source electrode 9sA and a drain electrode 9dA are formed in the memory transistor formation region R(10A), a capacitance electrode 9cs is formed in the capacitance portion formation region R(20), and a source electrode 9sB and a drain electrode 9dB are formed in the circuit constituent transistor formation region R(10B) as shown in FIG. 9(a) to FIG. 9(c). A layer which includes these wires and electrodes formed from the electrically-conductive film for the source is referred to as "source wire layer".

In the memory transistor formation region R(10A) and the circuit constituent transistor formation region R(10B), the source electrode 9sA and the drain electrode 9dA are electrically separated from each other and are arranged such that each of the source electrode 9sA and the drain electrode 9dA is in contact with a part of the active layer 7A. Likewise, the source electrode 9sB and the drain electrode 9dB are electrically separated from each other and are arranged such that each of the source electrode 9sB and the drain electrode 9dB is in contact with a part of the active layer 7B. Regions of the active layers 7A, 7B which overlap the corresponding gate electrodes 3A, 3B and which are located between the source electrodes 9sA, 9sB and the drain electrodes 9dA, 9dB are channel regions 7cA, 7cB. In the present embodiment, for example, in the memory transistor formation region R(10A), the source electrode 9sA and the drain electrode 9dA are arranged such that the channel region 7cA has a U-shape when viewed in a direction normal to the substrate 1. Meanwhile, in the circuit constituent transistor formation region R(10B), the source electrode 9sB and the drain electrode 9dB are arranged such that the channel region 7cB has a rectangular shape when viewed in a direction normal to the substrate 1. In this way, the memory transistor 10A and the circuit constituent transistor 10B are formed.

In the capacitance portion formation region R(20), a capacitance portion 20 is formed which includes the capacitance wire CS, the capacitance electrode 9cs, and a dielectric layer which is located between the capacitance wire CS and the capacitance electrode 9cs (here, gate insulating film 5). In the gate-source intersection formation region R(40), a gate-source intersection 40 is formed in which the gate wire G and the source wire S intersect each other with the gate insulating film 5 interposed therebetween. In the gate-source contact portion formation region R(30), the source connecting portion 9sg is arranged so as to extend over part of the gate connecting portion 3sg with the gate insulating film 5 interposed therebetween.

As the electrically-conductive film for the source, for example, a single layer film of aluminum (Al), chromium (Cr), copper (Cu), tantalum (Ta), titanium (Ti), molybdenum (Mo), or tungsten (W), a multilayer film consisting of two or more layers of these elements, or an alloy film including two or more of the above-described metal elements as constituents may be used. For example, a three-layer film which includes a Ti film, an Al film, and a Ti film in this order from the substrate 1 side (Ti/Al/Ti), or a three-layer film which includes a Mo film, an Al film, and a Mo film in this order (Mo/Ti/Mo), may be used. In the present embodiment, as an example, a three-layer film which includes a 10-100 nm thick Ti film, a 50-400 nm thick Al film, and a 50-300 nm thick Ti film in this order from the substrate 1 (Ti/Al/Ti) is used.

Then, a protection film (passivation film) 11 is formed by, for example, plasma CVD or sputtering so as to cover the source wire layer as shown in FIG. 10(a) to FIG. 10(c). As the protection film 11, for example, a single layer film, or a multilayer film consisting of two or more layers, selected from a silicon oxide film ($SiO_2$), a silicon nitride film (SiN), a silicon nitroxide film (SiNO), a silicon oxynitride film (SiON), aluminum oxide ($Al_2O_3$), and tantalum oxide ($Ta_2O_5$) may be used. In the present embodiment, as an example, a $SiO_2$ film (thickness: for example, 50-500 nm) formed by CVD is used as the protection film 11.

Thereafter, annealing is performed in air at 200-400° C. for about 30 minutes to 4 hours. Thereby, a reaction layer is formed at the interface between the source electrodes 9sA, 9sB and drain electrodes 9dA, 9dB and the active layers 7A, 7B. Thus, the contact resistance between the source electrodes 9sA, 9sB and drain electrodes 9dA, 9dB and the active layers 7A, 7B can be reduced.

Thereafter, as necessary, a flattening film may be formed on the passivation film 11. In the present embodiment, an organic insulating film 13 of a photosensitive resin, for example, is formed as the flattening film. The organic insulating film 13 is patterned by a known photolithographic method (exposure, development, baking). Thereby, an opening is formed in part of the organic insulating film 13 which is present over the gate-source contact portion formation region R(30). Thereafter, etching of the gate insulating film 5 and the passivation film 11 is performed using the organic insulating film 13 as a mask. In the etching, the source connecting portion 9sg and the gate connecting portion 3sg function as the etch stop. Therefore, part of the gate insulating film 5 which is covered with the source connecting portion 9sg is not etched away. In this way, a contact hole 15 is obtained through which the surfaces of the gate connecting portion 3sg and the source connecting portion 9sg are exposed.

Then, an electrically-conductive film is formed in the contact hole 15 and on the organic insulating film 13 and patterned. Thereby, in the gate-source contact portion formation region R(30), an upper electrically-conductive layer 17 is obtained which electrically couples the gate connecting portion 3sg and the source connecting portion 9sg in the contact hole 15. In this way, the gate-source contact portion 30 is formed.

In the present embodiment, a transparent electrically-conductive film, such as an ITO film (thickness: for example, about 20 nm to 300 nm), is used as the electrically-conductive film. Note that, although not shown, this electrically-conductive film also forms the pixel electrode of each pixel. In this way, the active matrix substrate 1002 is obtained.

<2. Integrated Circuit>

Next, an example of a semiconductor device in which the present embodiment is applied to an integrated circuit, such as VLSI, is described.

Figure 11:
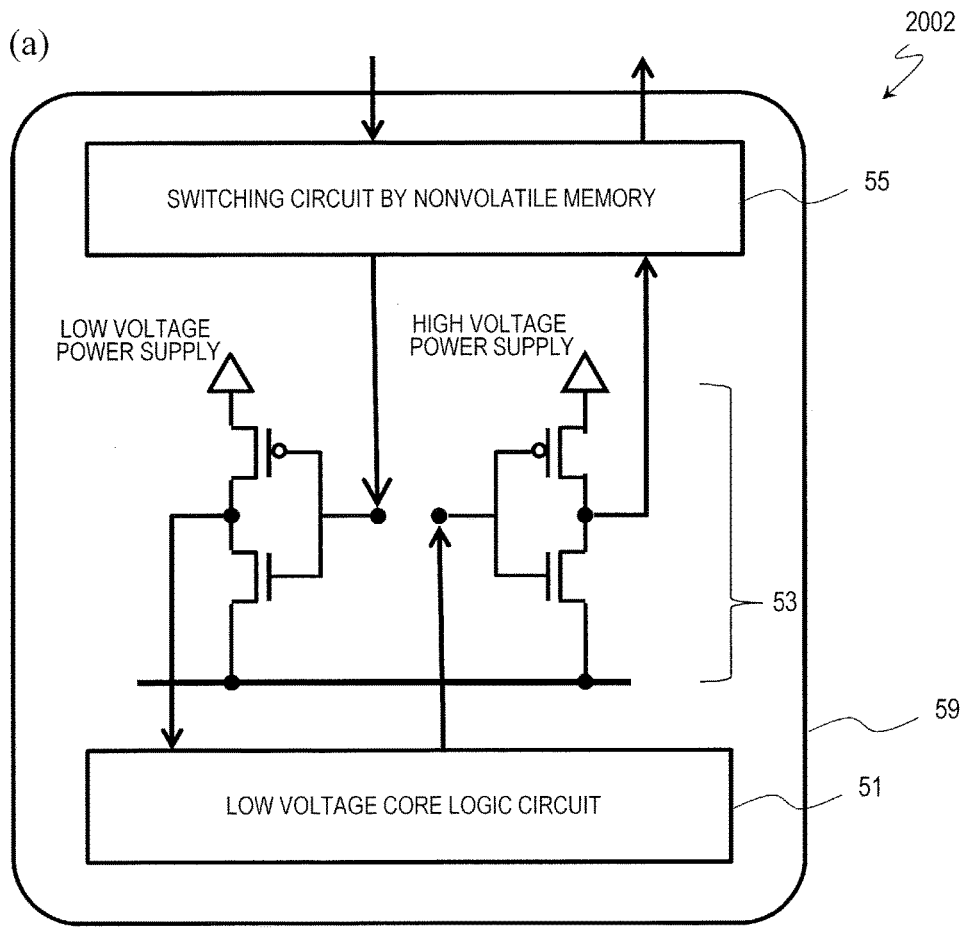
FIG. 11 (a) and (b) are a circuit block diagram illustrating a semiconductor device (integrated circuit) 2002 of the first embodiment and a cross-sectional view showing part of the semiconductor device.
Figure 11:
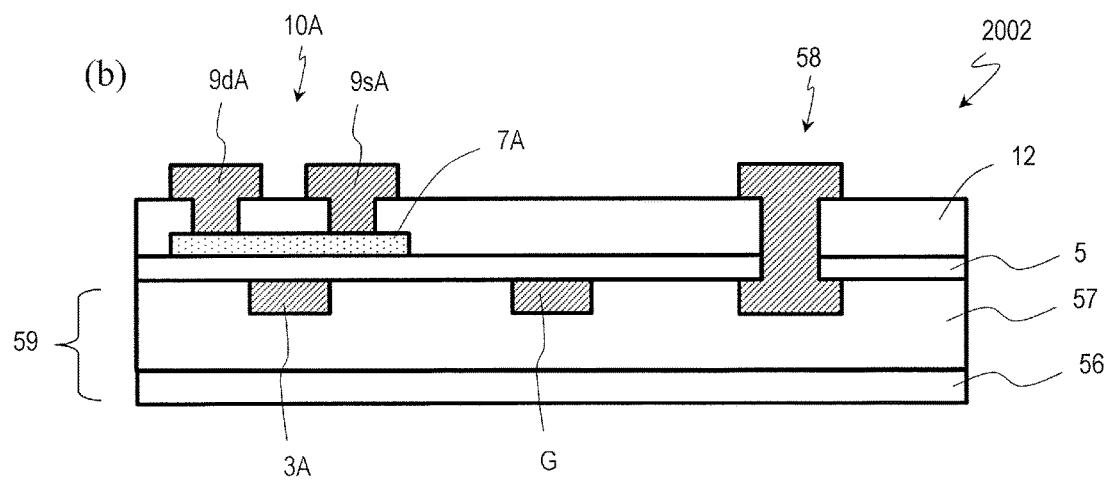
Figure 12:
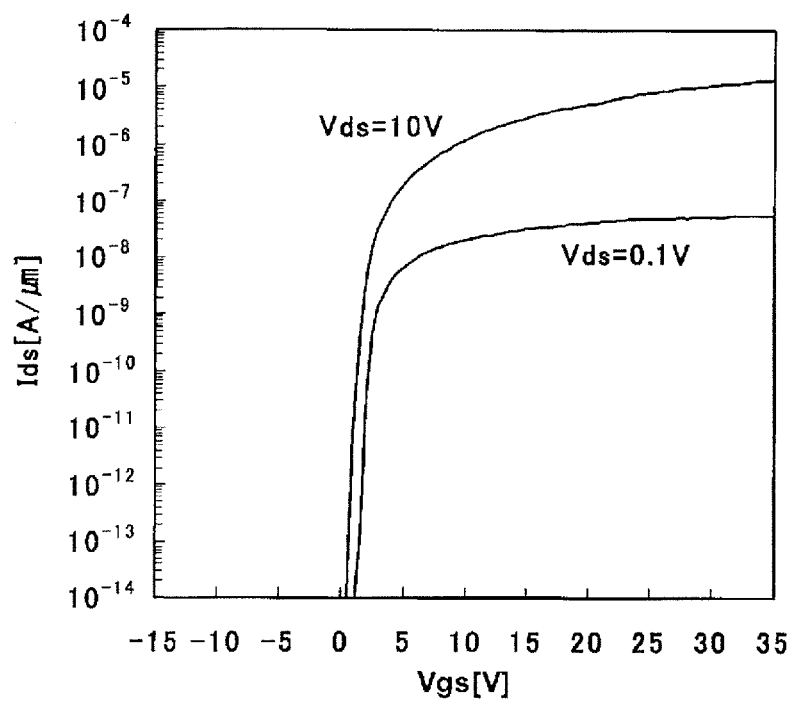
FIG. 12 (a) is a graph showing the Ids-Vgs characteristic in the initial state (semiconductor state) of the memory transistor 10A. (b) is a graph showing the Ids-Vds characteristic in the initial state of the memory transistor 10A.
Figure 12:
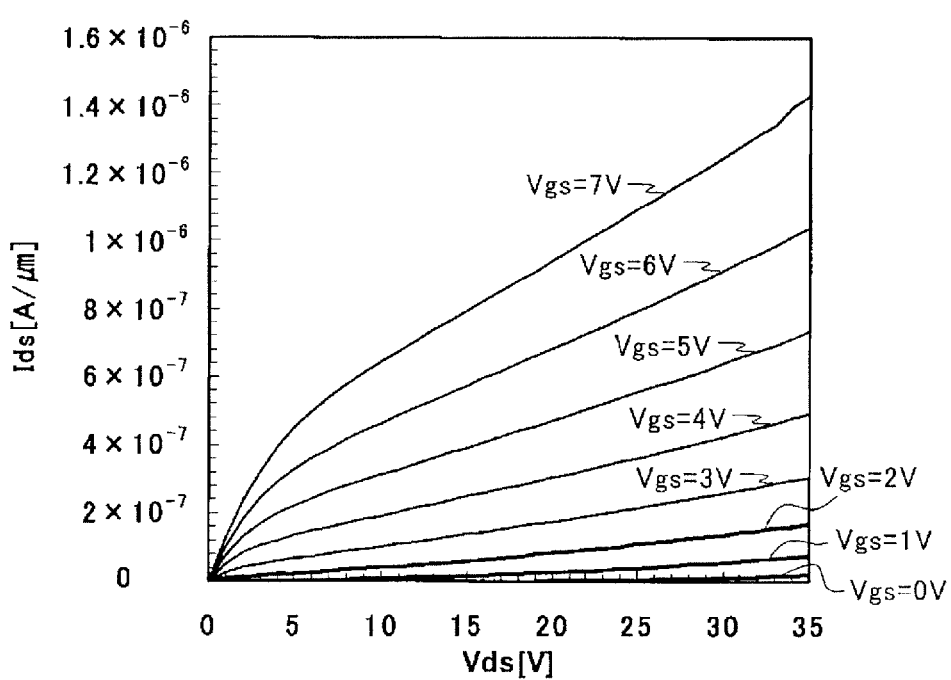
Figure 13:
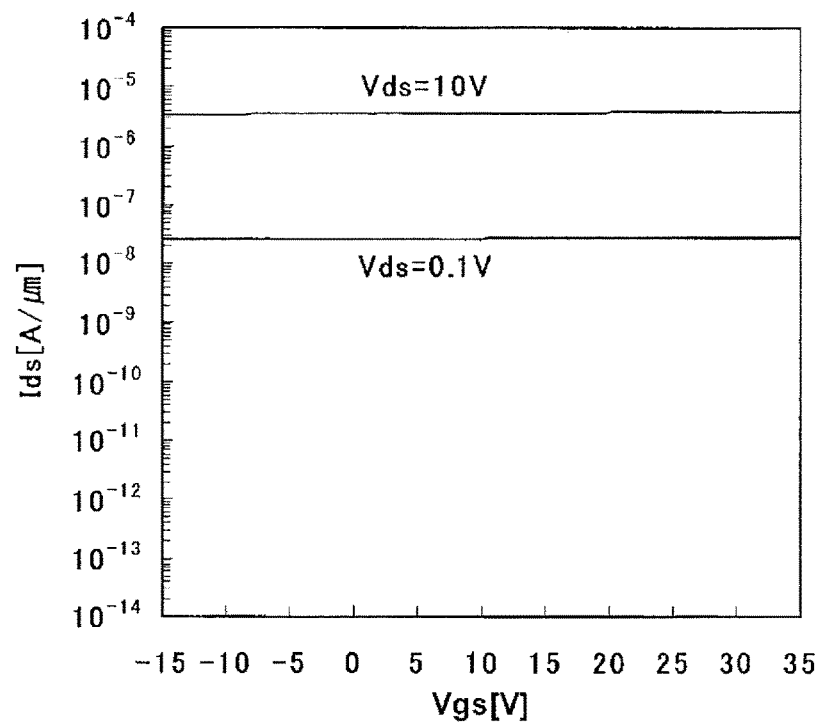
FIG. 13 (a) is a graph showing the Ids-Vgs characteristic in the resistor state of the memory transistor 10A. (b) is a graph showing the Ids-Vds characteristic in the resistor state of the memory transistor 10A.
Figure 13:
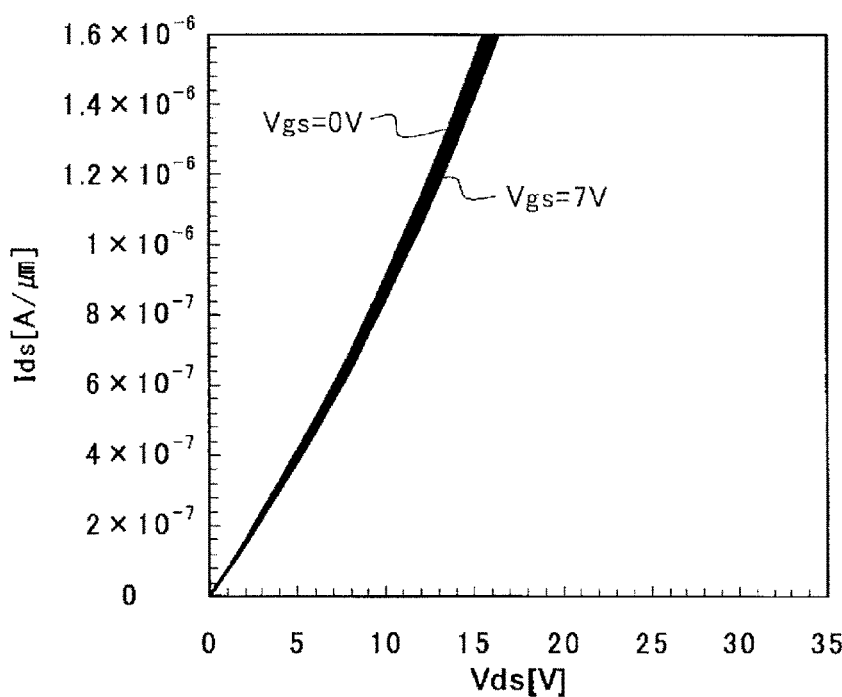

FIGS. 11(a) and 11(b) are a circuit block diagram illustrating a semiconductor device (integrated circuit) 2002 of the present embodiment and a cross-sectional view showing part of the semiconductor device.

The integrated circuit (VLSI) 2002 of the present embodiment includes a low voltage core logic circuit 51, a voltage converter circuit and buffer circuit 53, and a switching circuit 55 by a nonvolatile memory. These circuits 51, 53, 55 are supported on a LSI chip 59. The switching circuit 55 utilizes the nonvolatile memory device for switching wires. Thus, it is possible to realize switching of circuits, switching of functions, or change of circuit block configurations. The switching circuit 55 may be connected with, for example, a high voltage circuit provided outside the LSI chip 59 or an interface provided between chips.

In the present embodiment, the switching circuit 55 includes the memory transistor 10A as the nonvolatile memory device. For example, any one of, preferably all of, thin film transistors that are constituents of the voltage converter circuit and buffer circuit 53 or the switching circuit 55 corresponds to the circuit constituent transistor 10B.

As shown in FIG. 11(b), the LSI chip 59 includes an LSI element layer 56 and an interlayer insulating layer 57 covering the LSI element layer 56. The low voltage core logic circuit 51 is provided inside, for example. The voltage converter circuit and buffer circuit 53 and the switching circuit 55 are provided on the interlayer insulating layer 57. Note that FIG. 11(b) only shows the structures of the memory transistor 10A of the switching circuit 55, the wire section, and the contact portion 58. The circuit constituent transistor 10B is also provided on the interlayer insulating layer 57. The circuit constituent transistor 10B has the same transistor structure as the memory transistor 10A although the channel length and the channel width are different.

The semiconductor device of the present embodiment is not limited to a display device or an integrated circuit. For example, the memory transistor 10A and the circuit constituent transistor 10B can be manufactured at a relatively low temperature (for example, 200° C. or lower) and are therefore applicable to IC tags and the like. In this case, the memory transistor 10A can be utilized for memorization of ID. Further, since a transparent metal oxide film can be used as the oxide semiconductor film, the semiconductor device of the present embodiment can also be used in mass storage devices for digital signage. The semiconductor device of the present embodiment is applicable not only to storage devices but also to programmable logic circuit devices, such as ASIC (Application Specific Integrated Circuit) and FPGA (Field-Programmable Gate Array).

<Electric Characteristics of Memory Transistor 10A>

Now, the electric characteristics of the memory transistor 10A are described with reference to FIG. 12 to FIG. 17.

As the memory transistor 10A, an n-channel type thin film transistor was manufactured in which an In—Ga—Zn—O based semiconductor was used as the oxide semiconductor. The electric characteristics of the manufactured transistor were measured before and after writing. In the memory transistor 10A used for the measurement, channel length L1 was 4 μm, channel width W1 was 20 μm, the thickness of the active layer (oxide semiconductor layer) 7A was 20-100 nm, and the planar shape of the channel region 7cA was a rectangular shape or a U-shape.

Immediately after manufacture (initial state), the memory transistor 10A exhibits the same transistor characteristics as a normal thin film transistor. That is, drain current Ids (an electric current flowing from the drain electrode to the source electrode) varies depending on each of gate voltage Vgs (a voltage applied to the gate electrode relative to the source electrode) and drain voltage Vds (a voltage applied to the drain electrode relative to the source electrode).

FIG. 12(a) is a graph which illustrates the Ids-Vgs characteristic in the initial state of the memory transistor 10A where Vds=0.1 V and Vds=10 V. FIG. 12(b) is a graph which illustrates the Ids-Vds characteristic in the initial state of the memory transistor 10A where Vgs was changed from 0 to 7 V stepwise by 1 V. Note that, in FIGS. 12(a) and 12(b), the value of drain current Ids refers to the value of the drain current per unit gate width (1 μm) (unit drain current).

As clearly seen from FIGS. 12(a) and 12(b), in the memory transistor 10A which is in the initial state, when gate voltage Vgs is in the range of not more than about 0.5 V (specific voltage range) while drain voltage Vds is in the range of not less than 0.1 V and not more than 10 V, the unit drain current is extremely small (for example, not more than $1 \times 10^{-14}$ A/μm). This means that the memory transistor 10A is substantially in an OFF state. When gate voltage Vgs is greater than the above-described specific voltage range, drain current Ids increases as gate voltage Vgs increases (FIG. 12(a)). Also, drain current Ids increases as drain voltage Vds increases (FIG. 12(b)).

A writing operation was performed on the memory transistor 10A which was in the initial state (or "semiconductor state"), and the electric characteristics after the writing were examined. The writing was realized by applying predetermined gate voltage Vgs and drain voltage Vds to the memory transistor 10A such that a large drain current flows through the channel region 7cA. Due to the drain current, Joule heat is locally produced in the active layer 7A, whereby the electric resistance of the channel region 7cA can be reduced. Note that gate voltage Vgs applied during writing is set to, for example, a voltage higher than the range of a gate voltage applied to a circuit constituent transistor due to a circuit operation. Here, drain voltage Vds at 24 V and gate voltage Vgs at 30 V were applied to the memory transistor 10A for writing. The writing duration (the conduction duration of drain current Ids) was 100 msec.

FIG. 13(a) is a graph showing the Ids-Vgs characteristic after a writing operation of the memory transistor 10A in the case where Vds=0.1 V and Vds=10 V. FIG. 13(b) is a graph showing the Ids-Vds characteristic after a writing operation of the memory transistor 10A in the case where Vgs was changed from 0 to 7 V stepwise by 1 V.

Figure 14:
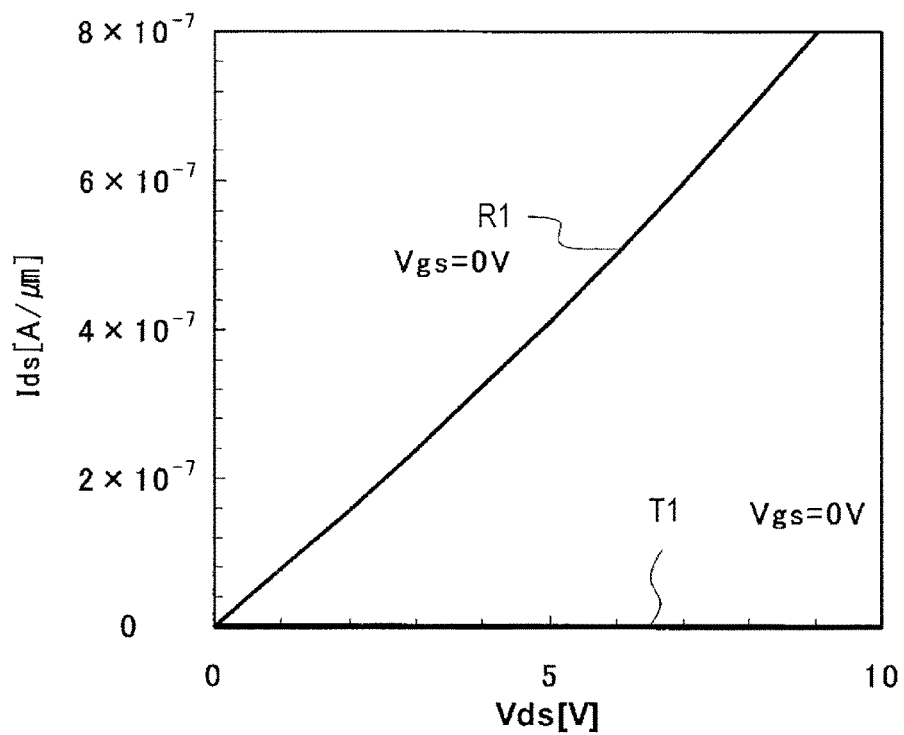
FIG. 14 A graph enlargedly showing the Ids-Vds characteristic near the origin in the memory transistor 10A immediately before and after writing in the case where Vgs=0 V.

FIG. 14 is a graph enlargedly showing the Ids-Vds characteristic near the origin in the case where Vgs=0 V, in the memory transistor 10A before writing (initial state) and after writing, for the sake of comparison of the electric characteristics exhibited before and after the writing. Line R1 represents the Ids-Vds characteristic before the writing. Line T1 represents the Ids-Vds characteristic after the writing.

Figure 15:
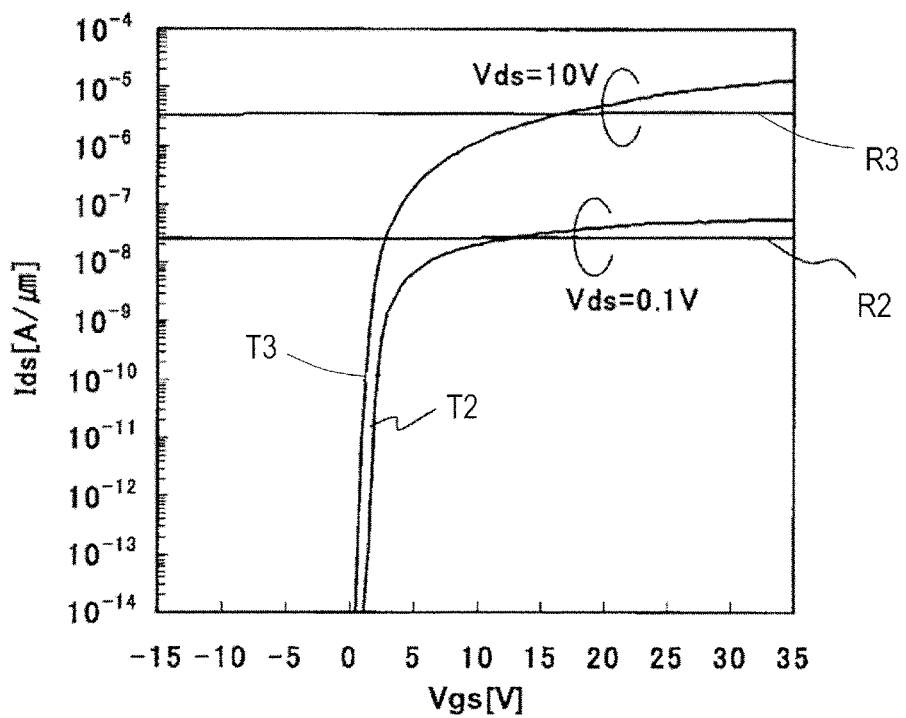
FIG. 15 A graph superposedly showing the Ids-Vgs characteristics of the memory transistor 10A before and after writing.

FIG. 15 is a graph superposedly showing the Ids-Vgs characteristics of the memory transistor 10A before and after writing. Lines T2 and T3 represent the Ids-Vgs characteristics before writing when Vds was 0.1 V and 10 V, respectively. Lines R2 and R3 represent the Ids-Vgs characteristics after writing when Vds was 0.1 V and 10 V, respectively.

Figure 16:
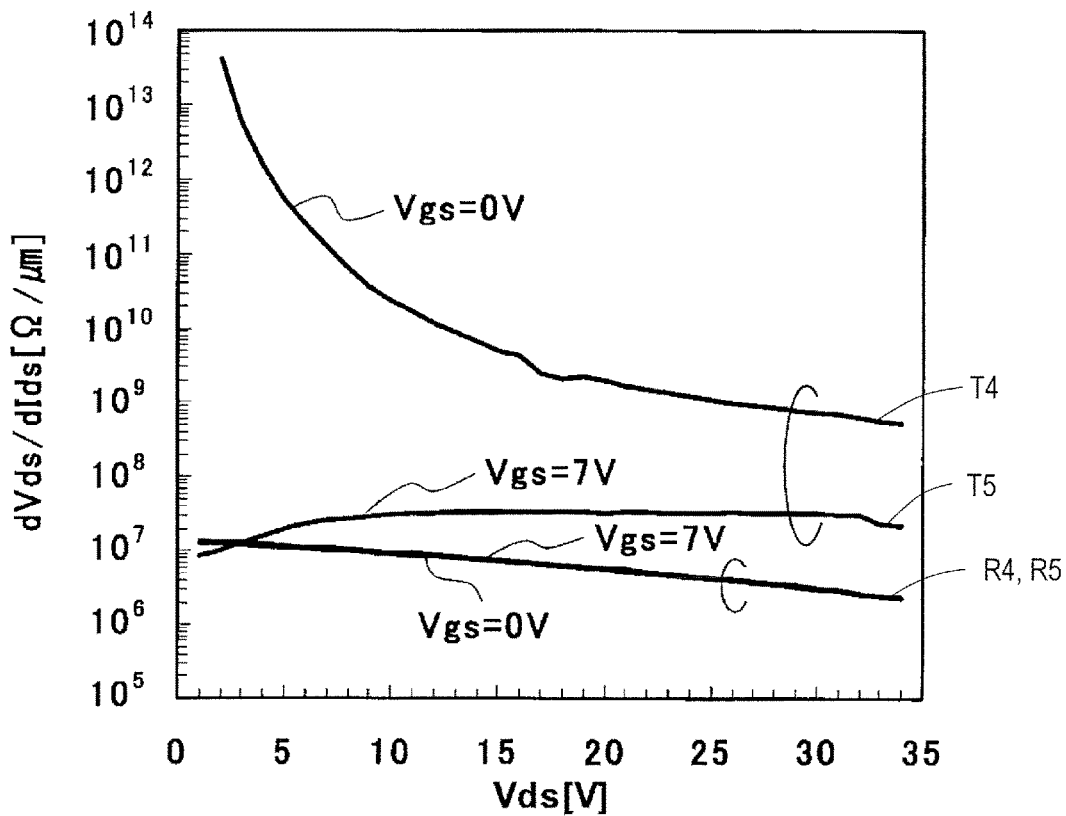
FIG. 16 A graph showing the relationship between the differential resistivity (dVds/dIds, unit: Ωμm) and drain voltage Vds of the memory transistor 10A before and after writing.

FIG. 16 is a graph showing the relationship between the differential resistivity (dVds/dIds, unit: Ωμm) and drain voltage Vds of the memory transistor 10A before and after writing. Lines T4 and T5 represent the relationship between dVds/dIds and Vds before writing when gate voltage Vgs was 0 V and 7 V, respectively. Lines R4 and R5 represent the relationship between dVds/dIds and Vds after writing when gate voltage Vgs was 0 V and 7 V, respectively.

As clearly seen from FIGS. 13(a) and 13(b), in the memory transistor 10A after writing, drain current Ids rarely depends on gate voltage Vgs but varies mainly depending on drain voltage Vds. When drain voltage Vds is constant, drain current Ids has a generally constant value. The IV curve in each gate voltage Vgs of the Ids-Vds characteristic is generally linear irrespective of gate voltage Vgs and passes through the origin (Ids=0 A/μm, Vds=0 V). That is, it can be seen that the memory transistor 10A after writing is a resistor which exhibits an ohmic resistance characteristic. The differential resistivity (dVds/dIds) at the origin has a finite value which is not equal to the infinity or zero (0).

In the memory transistor 10A which is in the initial state, drain current Ids varies largely depending on gate voltage Vgs when drain voltage Vds is constant. When gate voltage Vgs is within the specific voltage range (e.g., not more than about 0.5 V), drain current Ids scarcely flows, so that the memory transistor 10A is substantially in an OFF state. On the other hand, after writing, when drain voltage Vds is constant, a constant drain current Ids flows irrespective of gate voltage Vgs. When gate voltage Vgs is within the specific voltage range, the unit drain current is not less than $1\times10^{-11}$ A/μm so long as the drain voltage is within a range of not less than 0.1 V and not more than 10 V, for example.

Thus, in the memory transistor 10A, when it is in a semiconductor state, while the absolute value of the drain voltage is in a range of not less than 0.1 V and not more than 10 V, there is a voltage range for the gate voltage in which the absolute value of the drain current per unit channel width Ids/W1 falls in a very small electric current state of, for example, not more than $1\times10^{-14}$ A/μm. After transition to a resistor state, even when the gate voltage is set within the above-described voltage range while the absolute value of the drain voltage is in a range of not less than 0.1 V and not more than 10 V, the absolute value of the drain current per unit channel width Ids/W1 falls in an electric current state of, for example, not less than $1\times10^{-11}$ A/μm according to the drain voltage.

Further, as seen from FIG. 16, the differential resistivity dVds/dIds in the initial state varies depending on gate voltage Vgs. On the other hand, the differential resistivity dVds/dIds after writing does not vary depending on gate voltage Vgs.

Next, additional description of the writing operation of the memory transistor 10A is provided. The writing operation of the memory transistor 10A is realized by allowing drain current Ids of a high current density to flow through the channel region 7cA for a predetermined writing duration. The flowing drain current Ids of a high current density is in a higher bias state than the voltage ranges of gate voltage Vgs and drain voltage Vds which are applied to the memory transistor 10A in a circuit operation other than the writing operation. Since drain current Ids of a predetermined high current density flows for a predetermined writing duration, Joule heat and electromigration occur in the channel region 7cA. Accordingly, it is estimated that, the composition of a metal oxide semiconductor which is a constituent of the channel region 7cA (active layer 7A) changes, so that decrease of the resistance is induced. Note that, if the thickness of the active layer 7A is constant, the unit drain current (unit: A/μm) is proportional to the current density of the drain current (unit: A/m²). By increasing the unit drain current (unit: A/μm), the current density of the drain current (unit: A/m²) increases. In the present embodiment, the unit drain current during the writing operation is, for example, about 1 pA/μm to 1 mA/μm, and the writing duration is, for example, about 10 μsec to 100 seconds. Gate voltage Vgs applied during writing is set so as to be, for example, more than 0 V and not more than 200 V, preferably not less than 30 V and not more than 100 V. Drain voltage Vds applied during writing is set so as to be, for example, more than 0 V and not more than 200 V, preferably not less than 30 V and not more than 100 V. Note that, however, voltages Vgs and Vds applied during writing are not limited to the above-described numerical ranges but can be appropriately set such that a desired unit drain current flows. The unit drain current during the writing operation and the writing duration are also not limited to the above-described numerical ranges. The unit drain current and the writing duration can vary depending on the type and thickness of the metal oxide semiconductor used for the active layer 7A and the device structure of the memory transistor 10A.

The electric characteristics of the memory transistor 10A are more likely to vary as the Joule heat produced in the memory transistor 10A is larger. For example, as the unit drain current Ids during writing increases, a larger amount of Joule heat can be produced.

Figure 17:
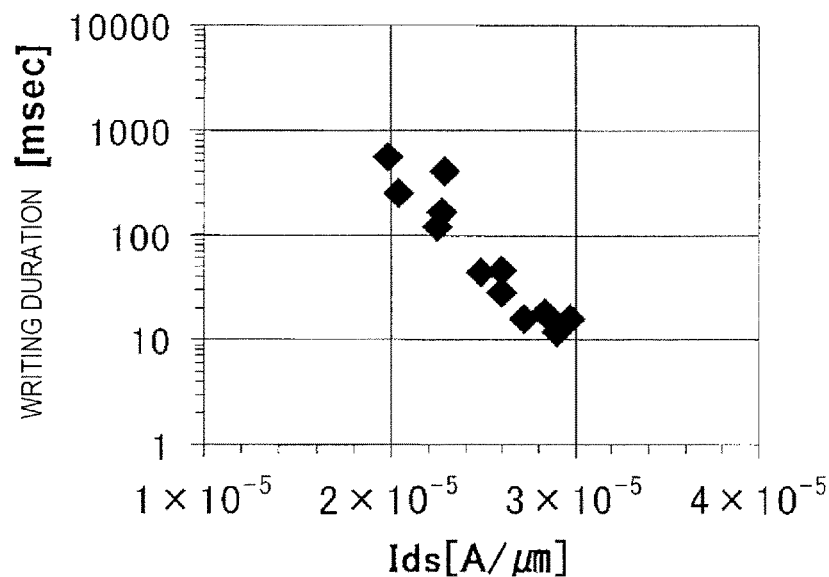
FIG. 17 A graph showing an example of the relationship between the writing duration (unit: msec) and the unit drain current (unit: A/μm) of the memory transistor 10A.

FIG. 17 shows an example of the relationship between the writing duration (unit: msec) and the unit drain current (unit: A/μm). As seen from FIG. 17, as the unit drain current increases, the Joule heat increases, and the writing duration can be shortened.

The unit drain current during writing can be increased by increasing gate voltage Vgs applied during writing or increasing the capacitance of the gate insulating film 5. Note that, however, gate voltage Vgs applied during writing is set to a value lower than the dielectric breakdown voltage of the gate insulating film 5. Therefore, in order to further increase gate voltage Vgs applied during writing, increasing the dielectric breakdown voltage of the gate insulating film 5 is preferred. From such a viewpoint, in the present embodiment, a material of high relative permittivity is used for the gate insulating film 5 in order to secure a large electric capacitance. As an insulative material of high relative permittivity, for example, a silicon nitride film (SiN) or a silicon nitroxide film (SiNO) may be used. The relative permittivities of these films are higher than that of a silicon oxide film ($SiO_2$). The intensity of the electric field imposed on the gate insulating film 5 may be kept at a low level by increasing the thickness of the gate insulating film 5 separately from or together with selection of a high permittivity material. This enables reduction of the dielectric breakdown voltage of the gate insulating film 5. Note that when a silicon nitride film (SiN) or a silicon oxynitride film (SiON) is formed by CVD as an insulative film of high relative permittivity, hydrogen is included in these films. Therefore, when the SiN film or SiON film is in contact with the oxide semiconductor layer that is the active layer 7A, hydrogen causes a reaction with oxygen of the oxide semiconductor, and as a result, there is a probability that the active layer 7A becomes closer to a conductor. In view of such, in order to prevent direct contact between the active layer 7A and the silicon nitride film (SiN) or silicon nitroxide film (SiNO), a silicon oxide film ($SiO_2$) or silicon oxynitride film (SiON) in which the hydrogen concentration is low may be interposed therebetween.

<Configuration Example of Memory Transistor 10A>

To further increase drain current Ids during a writing operation of the memory transistor 10A, another gate electrode 18 may be provided on the opposite side to the gate electrode 3A in the active layer 7A.

FIGS. 18(a) and 18(b) are a plan view and cross-sectional view illustrating the configuration of another memory transistor 10A in the present embodiment. In this example, an upper gate electrode 18 is provided above the active layer 7A with interlayer insulating layers (here, the passivation film 11 and the organic insulating film 13) interposed therebetween. The upper gate electrode 18 is arranges so as to extend over at least the channel region 7cA of the active layer 7A when viewed in a direction normal to the substrate 1. The upper gate electrode 18 may be a transparent electrode formed from a transparent electrically-conductive film which is common among the transparent electrode and the pixel electrode, for example. The upper gate electrode 18 may be connected to the gate electrode (gate wire) 3A, which is on the substrate 1 side of the active layer 7A, via a contact hole CH. Due to this arrangement, the another gate electrode 18 and the gate electrode 3A are at the same potential, and therefore, drain current Ids can be further increased due to the backgate effect. In the example shown in FIG. 18(a), the upper gate electrode 18 is shown as a transparent electrode, although it does not need to be a transparent electrode. Providing the upper gate electrode 18 in the memory transistor 10A in this way enables to increase the Joule heat and shorten the writing duration without greatly increasing gate voltage Vgs. Note that the upper gate electrode 18 may not be provided in the circuit constituent transistor 10B while the upper gate electrode 18 is provided in the memory transistor 10A. In this case, the difference in writing speed between the memory transistor 10A and the circuit constituent transistor 10B can be further increased.

Figure 18:
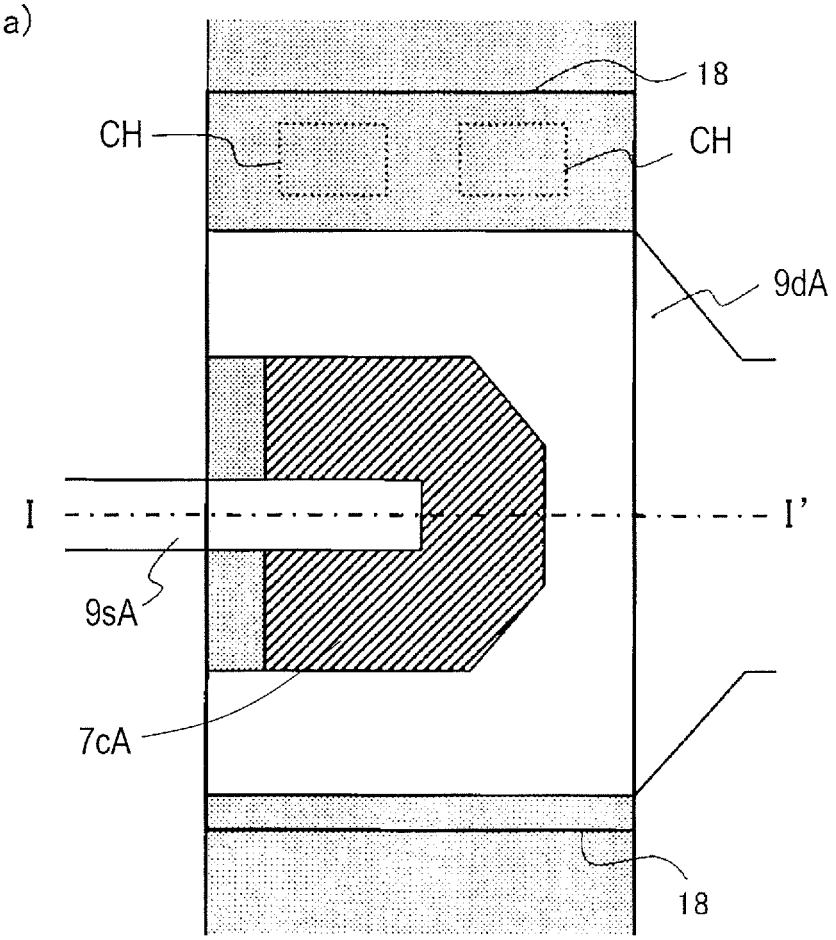
FIG. 18 (a) and (b) are a plan view and cross-sectional view illustrating the configuration of another memory transistor in the first embodiment.
Figure 18:
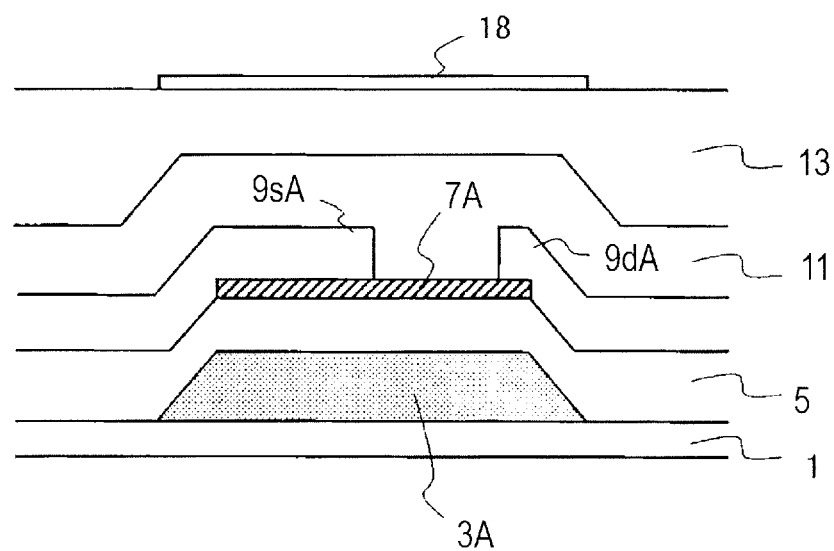

The configurations of the memory transistor 10A and the circuit constituent transistor 10B of the present embodiment are not limited to those shown in FIG. 2 and FIG. 18. The memory transistor 10A and the circuit constituent transistor 10B may have an etch stop structure in which an etch stop layer is provided so as to be in contact with the surface of the channel region 7cA as will be described later. Alternatively, the memory transistor 10A and the circuit constituent transistor 10B may have a bottom contact structure in which the active layer 7A is provided on the source and drain electrodes and the lower surface of the active layer 7A is in contact with these electrodes.

(Second Embodiment)

Hereinafter, the second embodiment of the semiconductor device of the present invention is described. The semiconductor device of the present embodiment is different from the semiconductor device of the first embodiment in that a protection layer is provided as the etch stop over the active layer of the memory transistor 10A and the circuit constituent transistor 10B. The other components are the same.

Figure 19:
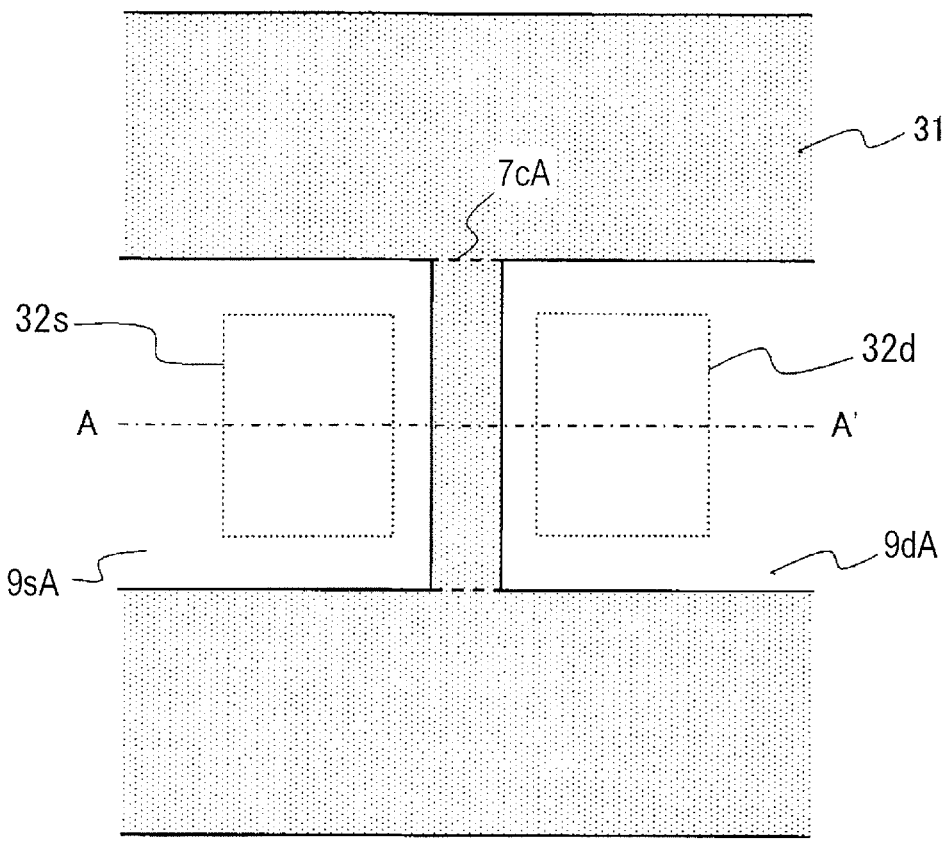
FIG. 19 (a) and (b) are a plan view and cross-sectional view showing a memory transistor 10A in a semiconductor device of the second embodiment.
Figure 19:
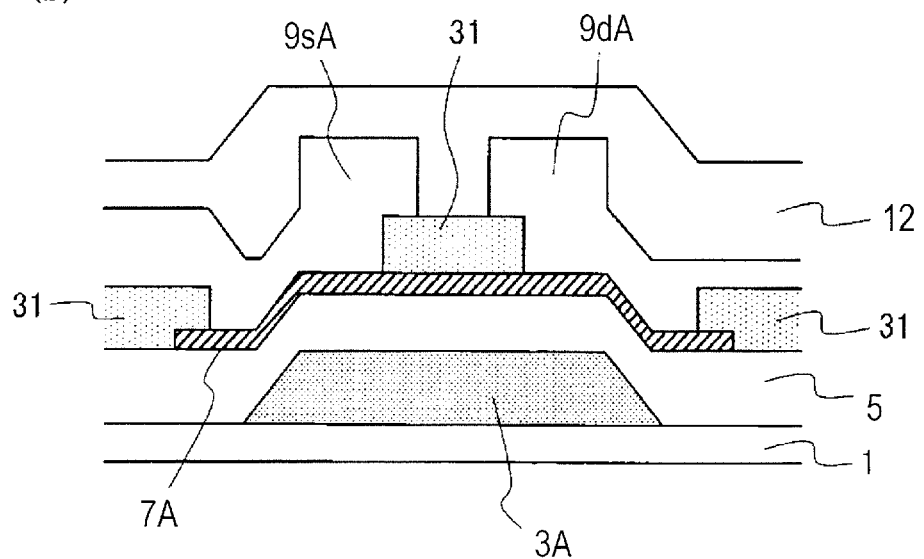
Figure 20:
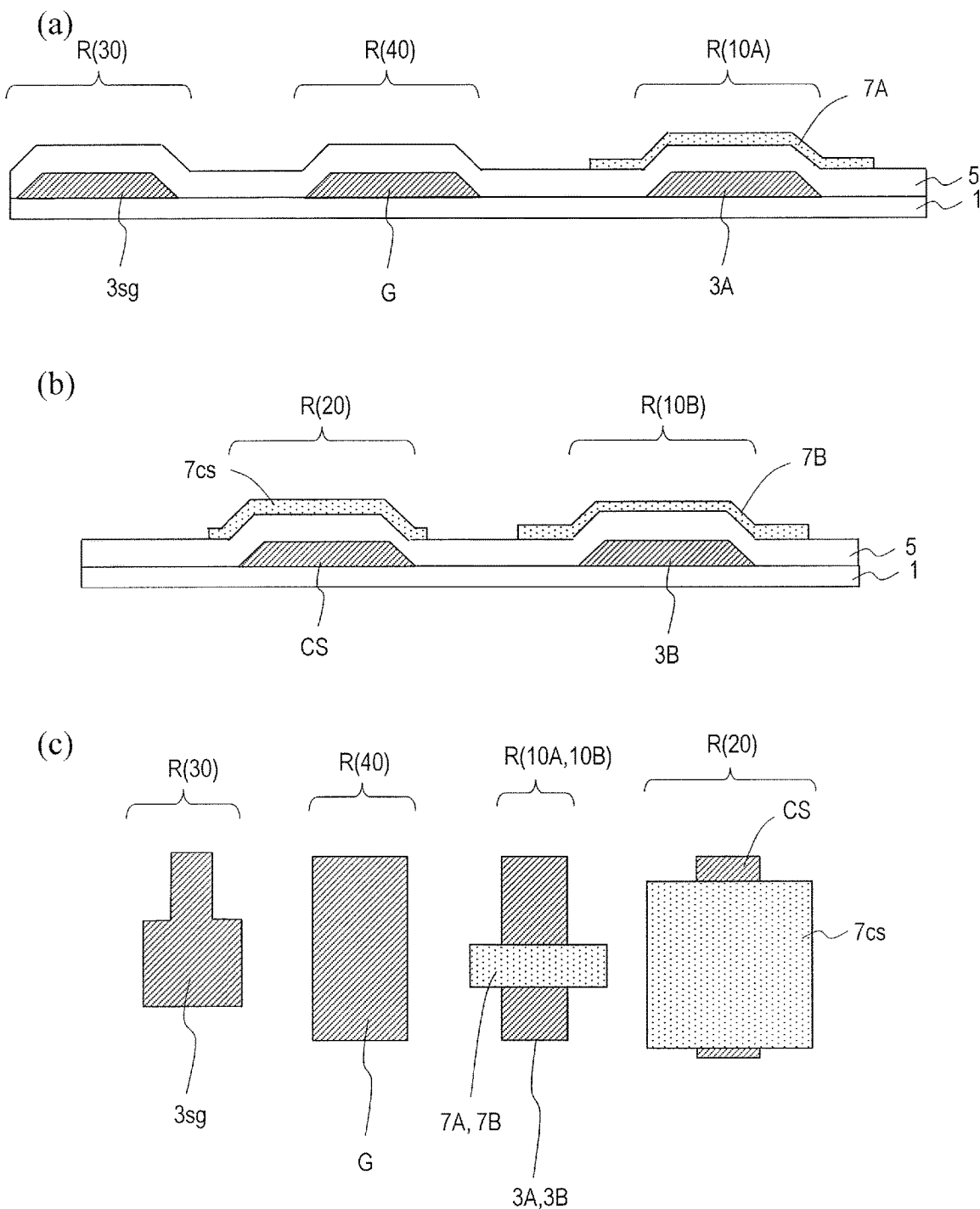
FIG. 20 Process diagrams for illustrating a manufacturing method of a semiconductor device (active matrix substrate 1003) of the second embodiment. (a) and (b) are cross-sectional views. (c) is a top view.
Figure 21:
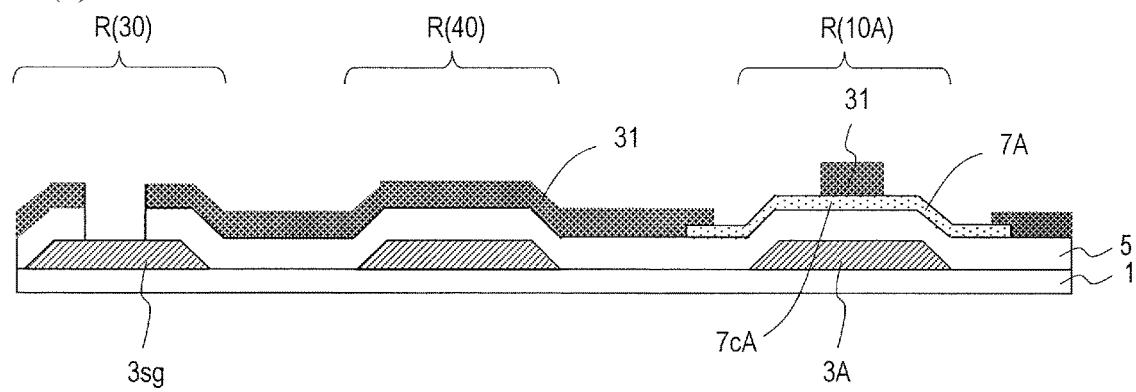
FIG. 21 Process diagrams for illustrating a manufacturing method of a semiconductor device (active matrix substrate 1003) of the second embodiment. (a) and (b) are cross-sectional views. (c) is a top view.
Figure 21:
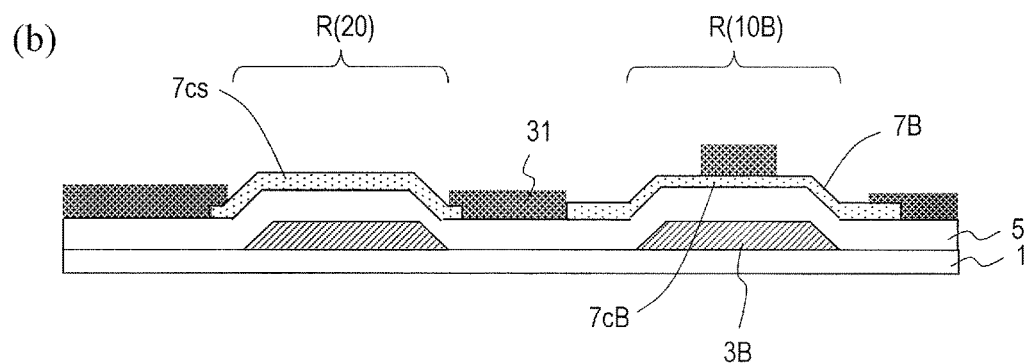
Figure 21:
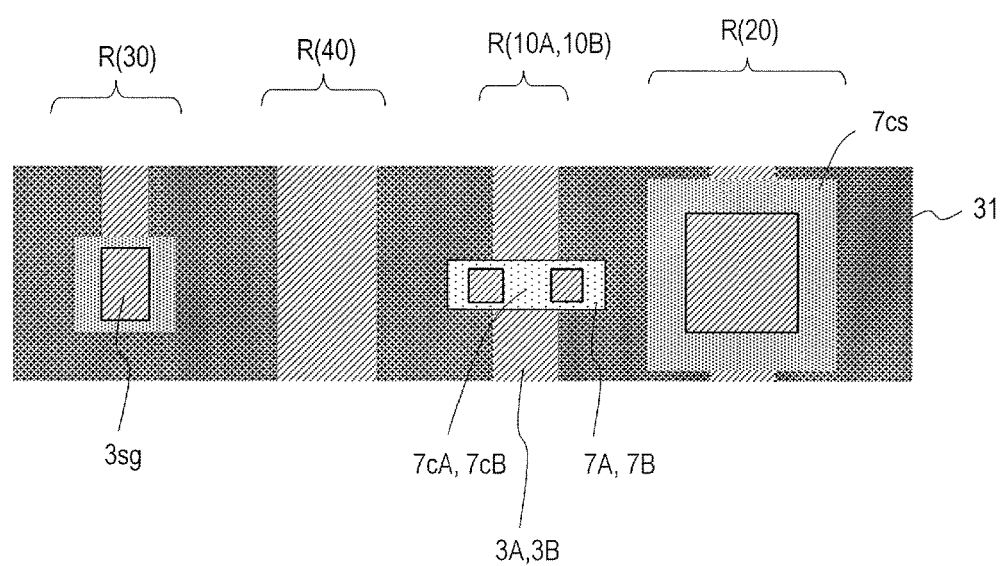
Figure 22:
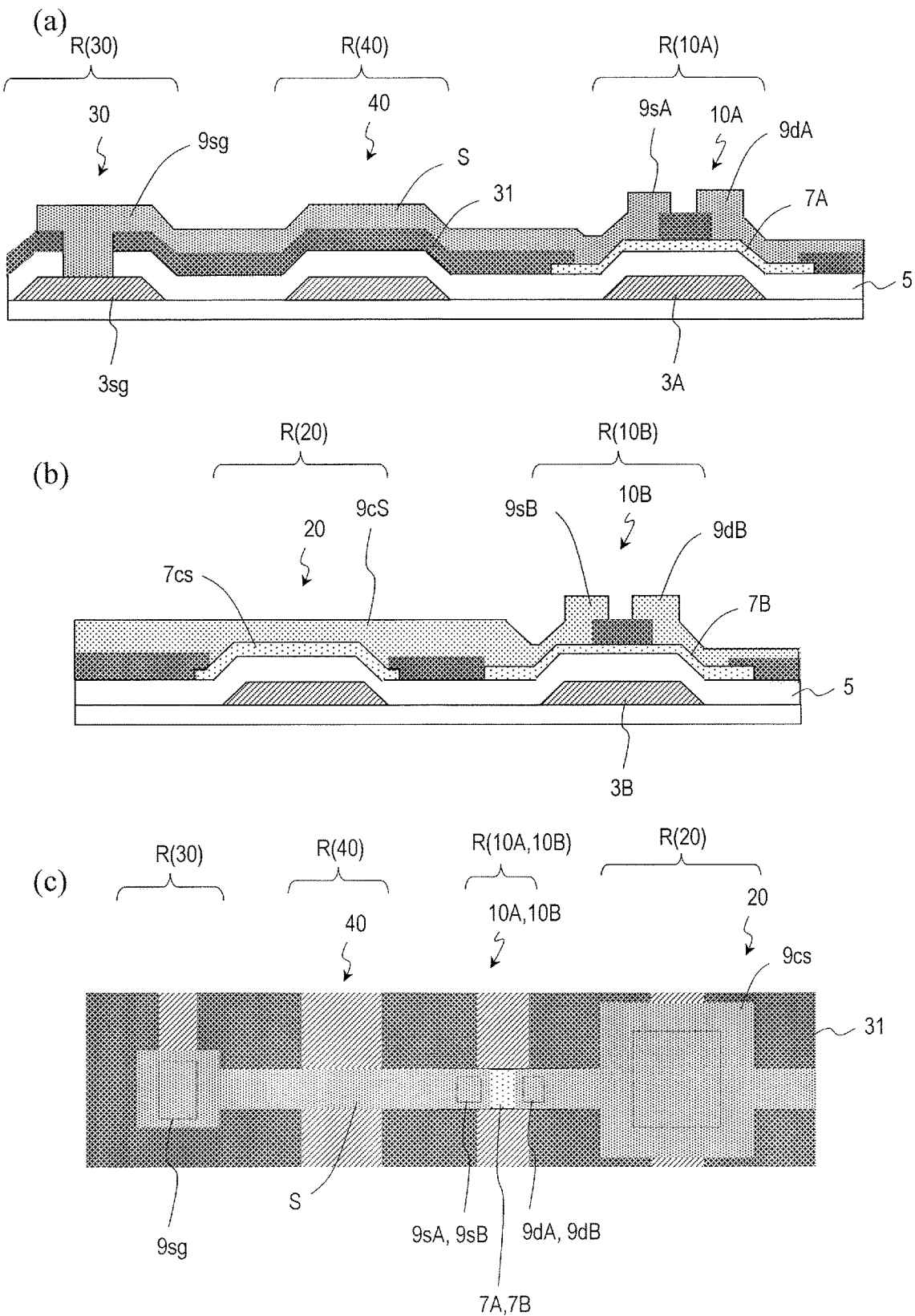
FIG. 22 Process diagrams for illustrating a manufacturing method of a semiconductor device (active matrix substrate 1003) of the second embodiment. (a) and (b) are cross-sectional views. (c) is a top view.

FIGS. 19(a) and 19(b) are a plan view and cross-sectional view showing an example of the configuration of a memory transistor 10A in the second embodiment. The cross section shown in FIG. 19(b) is a cross section taken along line A-A' of FIG. 19(a). In FIG. 19, elements which are equivalent to those of FIG. 2 are designated by the same reference numerals, and descriptions thereof are herein omitted. Note that, although not shown, the circuit constituent transistor 10B has the same transistor structure as that of the illustrated memory transistor 10A although the channel length and the channel width are different.

The memory transistor 10A includes a protection layer 31 at least over the channel region 7cA of the active layer 7A. The width in the channel direction of the active layer 7A is greater than the width in the channel direction of the gate electrode 3A. In this example, the protection layer 31 is arranged so as to cover the active layer 7A. The protection layer 31 has openings 32s, 32d through which parts of the active layer 7A on both sides of the channel region 7cA are exposed. The source electrode 9sA and the drain electrode 9dA are provided on the protection layer 31 and in the openings 32s, 32d and are in contact with the active layer 7A in the openings 32s, 32d. As a result, a region of the active layer 7A which is in contact with the source electrode 9sA forms a source contact region, and a region of the active layer 7A which is in contact with the drain electrode 9dA forms a drain contact region.

Although in FIG. 19 the planar shape of the channel region 7cA is rectangular, it may be a U-shape such as shown in FIG. 2(b).

Also in the present embodiment, channel length L1 and channel width W1 of the memory transistor 10A and channel length L2 and channel width W2 of the circuit constituent transistor 10B are set such that L1<L2 or W1>W1 holds true as in the first embodiment. Preferably, channel length L1, channel width W1, channel length L2, and channel width W2 are set such that L1/W1<L2/W2 holds true. In this case, the same effects as those of the first embodiment are obtained.

Next, a manufacturing method of the semiconductor device of the present embodiment is described with an example of an active matrix substrate with reference to the drawings.

FIG. 20 to FIG. 23 are process diagrams for illustrating an example of the manufacturing method of an active matrix substrate 1003. In respective drawings, (a) and (b) are cross-sectional views, and (c) is a top view. Here, the process of forming the memory transistor 10A, the circuit constituent transistor 10B, the capacitance portion 20, the gate-source contact portion 30 and the gate-source intersection 40 in the active matrix substrate 1003 is described. Note that, in the top view of (c), the memory transistor 10A and the circuit constituent transistor 10B are shown by a single diagram because they have the same transistor structure although the channel length and the channel width are different.

First, as shown in FIGS. 20(a) to 20(c), an electrically-conductive film for the gate is formed on the substrate 1 and then patterned so as to form a gate wire layer which includes a gate connecting portion 3sg, a gate wire G, a gate electrode 3A, a capacitance wire CS, and a gate electrode 3B. Thereafter, a gate insulating film 5 is formed so as to cover the gate wire layer. Then, an oxide semiconductor film is formed on the gate insulating film 5 and patterned such that an active layer 7A is formed in the memory transistor formation region R(10A) and an active layer 7B is formed in the circuit constituent transistor formation region R(10B). Meanwhile, a semiconductor layer 7cs is left in the capacitance portion formation region R(20) so as to extend over the capacitance wire CS with the gate insulating film 5 interposed therebetween. This embodiment is different from the previously-described embodiment in that the semiconductor layer 7cs is left in the capacitance portion formation region R(20). Further, in this example, the width in the channel direction of the active layers 7A, 7B is greater than the width in the channel direction of the gate electrodes 3A, 3B. Note that the material and thickness and the formation method of the respective layers are the same as those described in the first embodiment.

Then, as shown in FIGS. 21(a) to 21(c), an insulative protection film is formed on the gate insulating film 5, the active layers 7A, 7B, and the semiconductor layer 7cs and then patterned so as to obtain a protection layer 31.

In the patterning of the insulative protection film, the gate insulating film 5 underlying the insulative protection film is also etched away together. In this step, the active layers 7A, 7B and the semiconductor layer 7cs function as the etch stop, and therefore, parts of the gate insulating film 5 which are covered with these layers are not etched away. Here, by patterning, in the gate-source contact portion formation region R(30), an opening 33 through which the gate connecting portion 3sg is exposed is formed in the protection layer 31 and the gate insulating film 5. In the capacitance portion formation region R(20), an opening 34 through which the semiconductor layer 7cs is exposed is formed in the protection layer 31. Further, in the memory transistor and circuit constituent transistor formation regions R(10A, 10B), on both sides of parts of the active layers 7A, 7B which form the channel regions 7cA, 7cB, openings 32s, 32d are formed through which the active layers 7A, 7B are exposed.

The insulative protection film can be formed by, for example, plasma CVD or sputtering and patterned by a known dry etching method. After formation of the insulative protection film, annealing is performed in air at 200-450° C.

for about 30 minutes to 4 hours, for example. As the insulative protection film, for example, a single layer film, or a multilayer film consisting of two or more layers, selected from a silicon oxide film ($SiO_2$), a silicon nitride film (SiN), a silicon nitroxide film (SiNO), a silicon oxynitride film (SiON), aluminum oxide ($Al_2O_3$), and tantalum oxide ($Ta_2O_5$) may be used. In the present embodiment, as an example, a $SiO_2$ film which has a thickness of 10 nm to 500 nm is used.

Then, as shown in FIGS. 22(a) to 22(c), an electrically-conductive film for the source is formed on the protection layer 31 and in the opening of the protection layer 31 and then patterned. Thereby, in the gate-source contact formation region R(30), a source connecting portion 9sg is obtained which is in contact with the gate connecting portion 3sg in the opening 33. Meanwhile, a source wire S is formed in the gate-source intersection formation region R(40). In the capacitance portion formation region R(20), a capacitance electrode 9cs is formed so as to be in contact with the semiconductor layer 7cs in the opening 34. Further, in the memory transistor and circuit constituent transistor formation regions R(10A, 10B), source electrodes 9sA, 9sB and drain electrodes 9dA, 9dB are obtained which are in contact with the active layers 7A, 7B, respectively, in the openings 32s, 32d. The material, thickness, and formation method of the electrically-conductive film for the source are the same as those of the electrically-conductive film for the source which has been described in the first embodiment. In this way, the gate-source contact portion 30 is formed in the gate-source contact portion formation region R(30), the gate-source intersection 40 is formed in the gate-source intersection formation region R(40), the capacitance portion is formed in the capacitance portion formation region R(20), and the memory transistor 10A and the circuit constituent transistor 10B are formed in the memory transistor and circuit constituent transistor formation regions R(10A, 10B).

Then, as shown in FIGS. 23(a) to 23(c), a protection film (passivation film) 11, an organic insulating film 13 of a photosensitive resin or the like, and an upper electrically-conductive layer 17 are formed. First, the protection film 11 and the organic insulating film 13 are formed in this order in the same way as that previously described in the first embodiment. Then, an opening is formed in part of the organic insulating film 13 extending over the gate-source contact portion formation region R(30). Thereafter, etching is performed on the passivation film 11 using the organic insulating film 13 as a mask. Thereby, a contact hole 15 is obtained through which the source connecting portion 9sg is exposed. Then, an electrically-conductive film is formed in the contact hole 15 and on the organic insulating film 13 and then patterned. Thereby, in the gate-source contact portion formation region R(30), an upper electrically-conductive layer 17 is obtained which is in contact with the source connecting portion 9sg in the contact hole 15. The material, thickness, and formation method of the protection film 11, the organic insulating film 13 and the electrically-conductive film are the same as those of these films which have been described in the first embodiment. In this way, the active matrix substrate 1003 is obtained.

The memory transistor 10A and the circuit constituent transistor 10B of the present embodiment have the etch stop layer (etch stop structure) and therefore have the following advantages over a transistor which does not have an etch stop layer (channel-etch structure).

In the present embodiment, an etching step of the electrically-conductive film for the source is performed for separation of the source and the drain with the channel regions 7cA, 7cB being covered with the protection layer 31. Therefore, damage to the channel regions 7cA, 7cB which is caused by the etching can be reduced as compared with a thin film transistor which has a channel-etch structure. Thus, variation of the electric characteristics of the memory transistor 10A and the circuit constituent transistor 10B can be improved. Further, the magnitude of the variation of the electric characteristics which is attributed to the electrical stress can be reduced. Further, in the gate-source contact portion 30, it is possible that the gate connecting portion 3sg and the source connecting portion 9sg are in direct contact with each other. Thus, the size of the gate-source contact portion 30 can be reduced, and accordingly, the circuit area can also be reduced.

(Third Embodiment)

Hereinafter, the third embodiment of the semiconductor device of the present invention is described. The semiconductor device of the present embodiment is different from the semiconductor device of the first embodiment in that an active layer is formed on the source and drain electrodes of the memory transistor 10A and the circuit constituent transistor 10B. The other components are the same.

Figure 24:
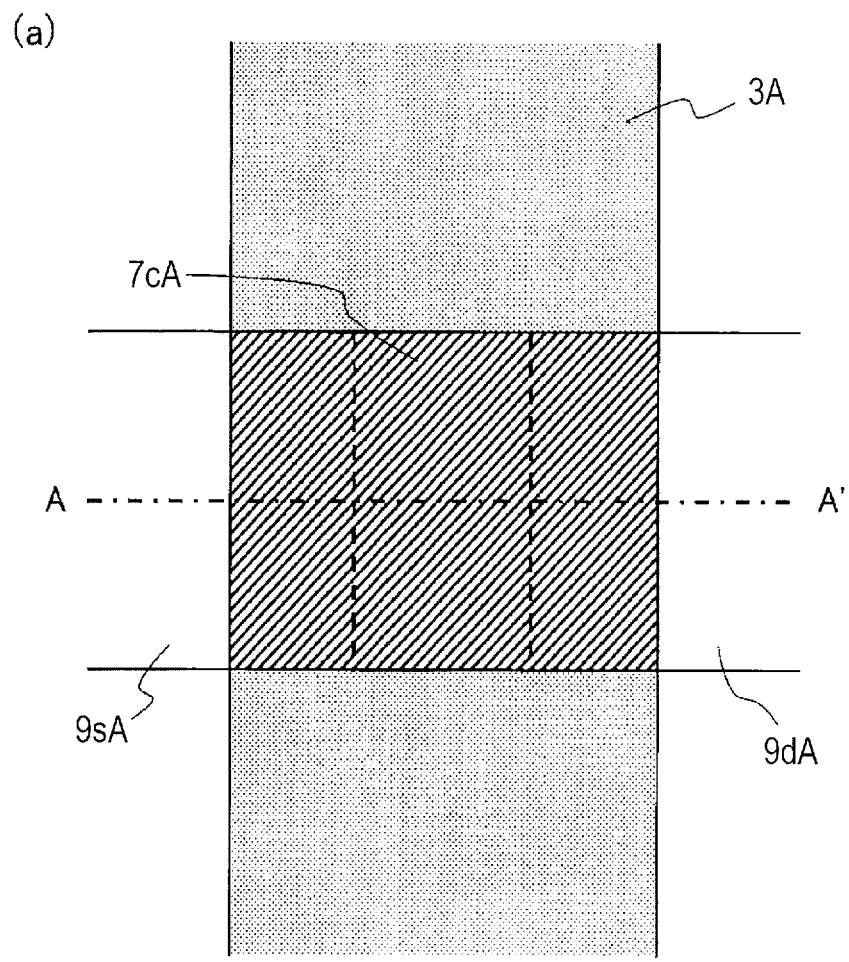
FIG. 24 (a) and (b) are a plan view and cross-sectional view showing a memory transistor 10A in a semiconductor device of the third embodiment.
Figure 24:
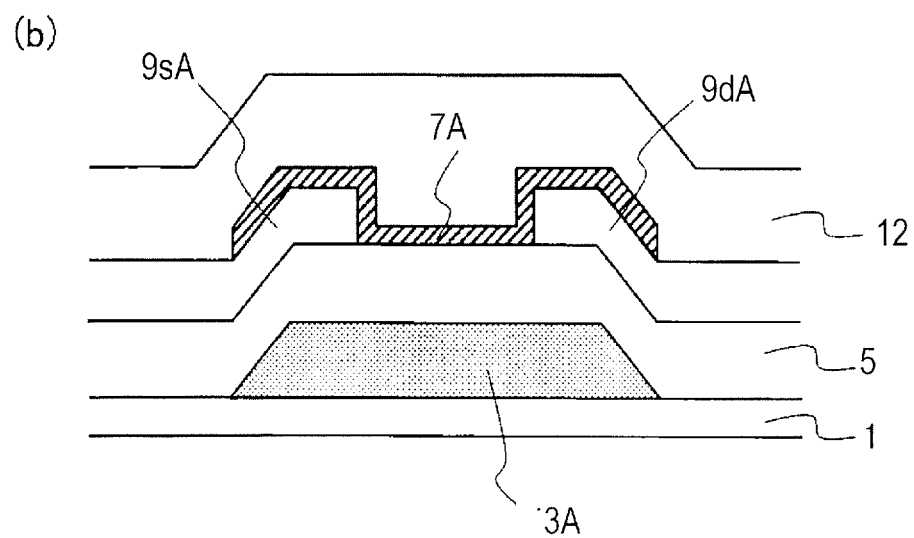

FIGS. 24(a) and 24(b) are a plan view and cross-sectional view showing an example of the configuration of a memory transistor 10A in the third embodiment. The cross section shown in FIG. 24(b) is a cross section taken along line A-A' of FIG. 24(a). In FIG. 24, elements which are equivalent to those of FIG. 2 are designated by the same reference numerals, and descriptions thereof are herein omitted. Note that the circuit constituent transistor 10B has the same transistor structure as that of the illustrated memory transistor 10A although the channel length and the channel width are different.

In the memory transistor 10A, a source electrode 9sA and a drain electrode 9dA are provided on a gate insulating film 5 that covers a gate electrode 3A such that the source electrode 9sA and the drain electrode 9dA are spaced away from each other. On the source electrode 9sA and the drain electrode 9dA, an active layer 7A is provided. The active layer 7A is arranged so as to be in contact with the gate insulating film 5 which is located between the source electrode 9sA and the drain electrode 9dA and with the upper surfaces and lateral surfaces of the source electrode 9sA and the drain electrode 9dA. A portion of the active layer 7A which extends over the gate electrode 3A and which is located between a region that is in contact with the lateral surface of the source electrode 9sA and a region that is in contact with the lateral surface of the drain electrode 9dA forms a channel region 7cA.

Although in FIG. 24 the planar shape of the channel region 7cA is rectangular, it may be a U-shape such as shown in FIG. 2(b).

Also in the present embodiment, channel length L1 and channel width W1 of the memory transistor 10A and channel length L2 and channel width W2 of the circuit constituent transistor 10B are set such that L1<L2 or W1>W1 holds true as in the first embodiment. Preferably, channel length L1, channel width W1, channel length L2, and channel width W2 are set such that L1/W1<L2/W2 holds true. In this case, the same effects as those of the first embodiment are obtained.

Next, a manufacturing method of the semiconductor device of the present embodiment is described with an example of an active matrix substrate with reference to the drawings.

Figure 25:
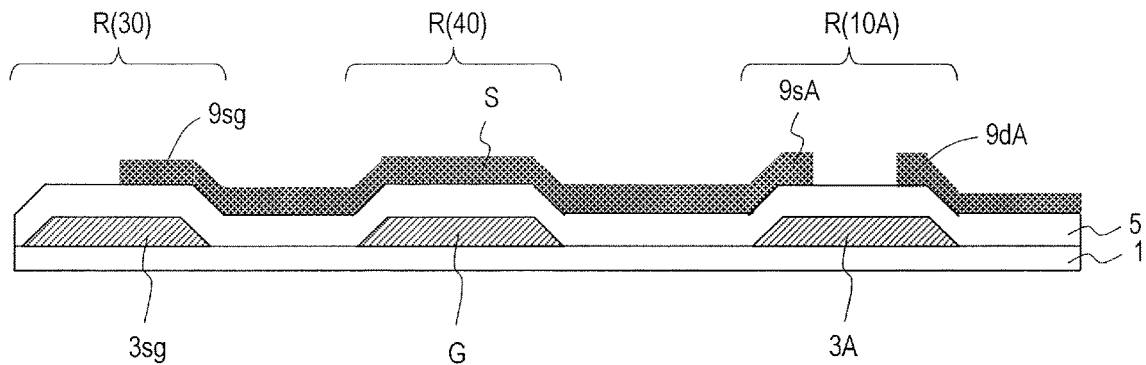
FIG. 25 Process diagrams for illustrating a manufacturing method of a semiconductor device (active matrix substrate 1004) of the third embodiment. (a) and (b) are cross-sectional views. (c) is a top view.
Figure 25:
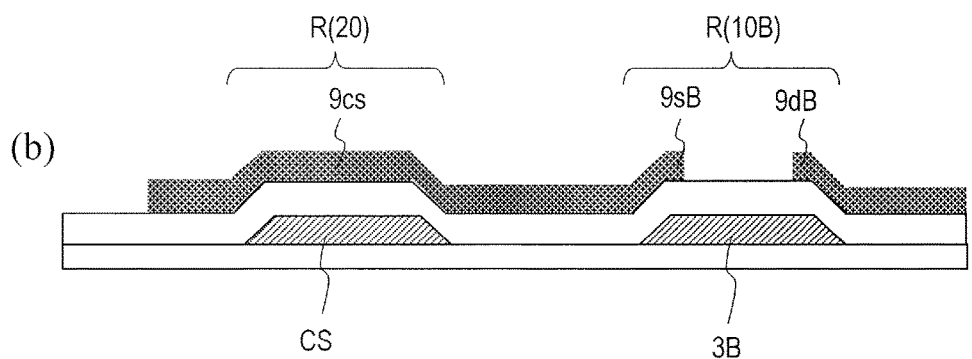
Figure 25:
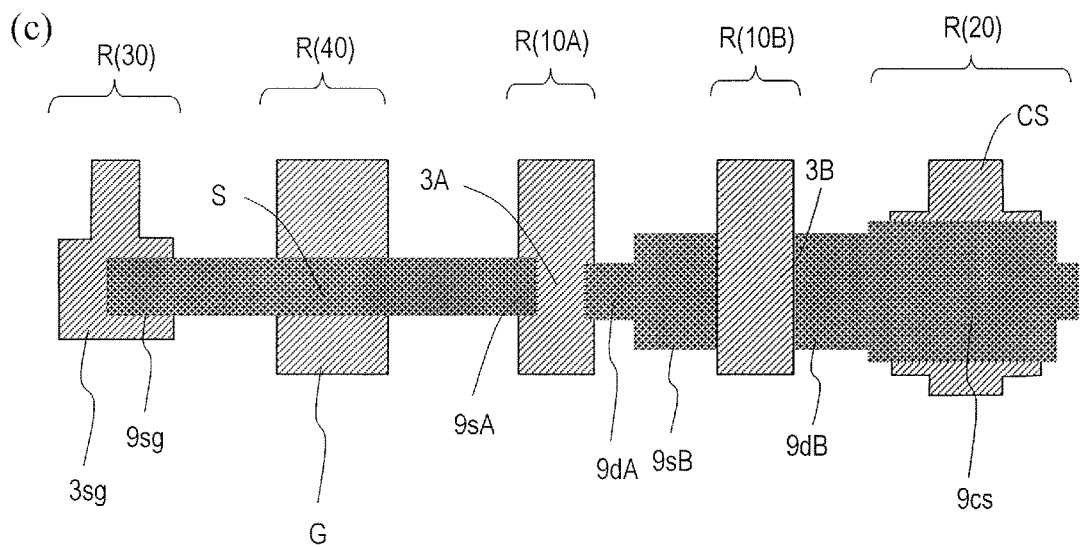
Figure 26:
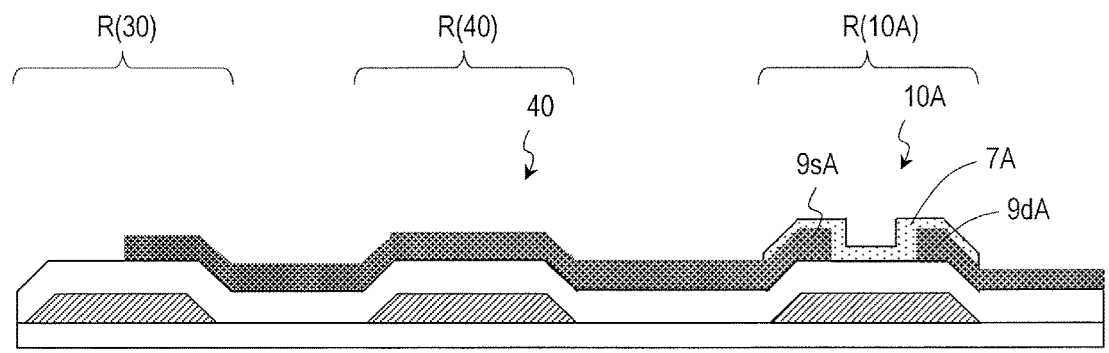
FIG. 26 Process diagrams for illustrating a manufacturing method of a semiconductor device (active matrix substrate 1004) of the third embodiment. (a) and (b) are cross-sectional views. (c) is a top view.
Figure 26:
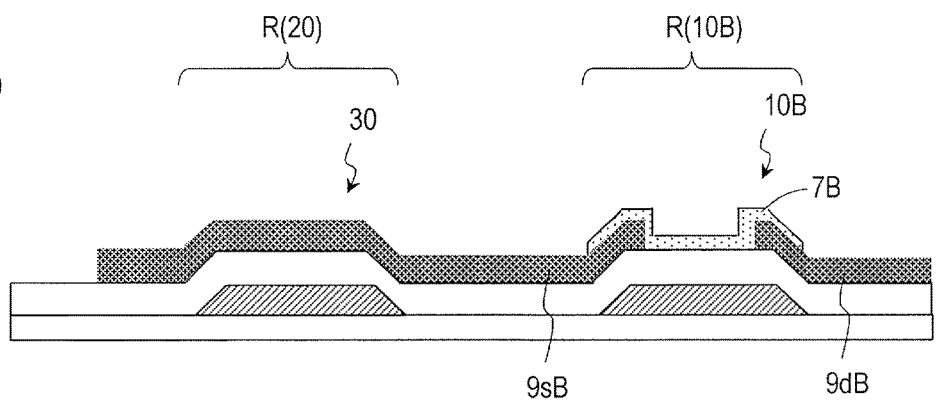
Figure 26:
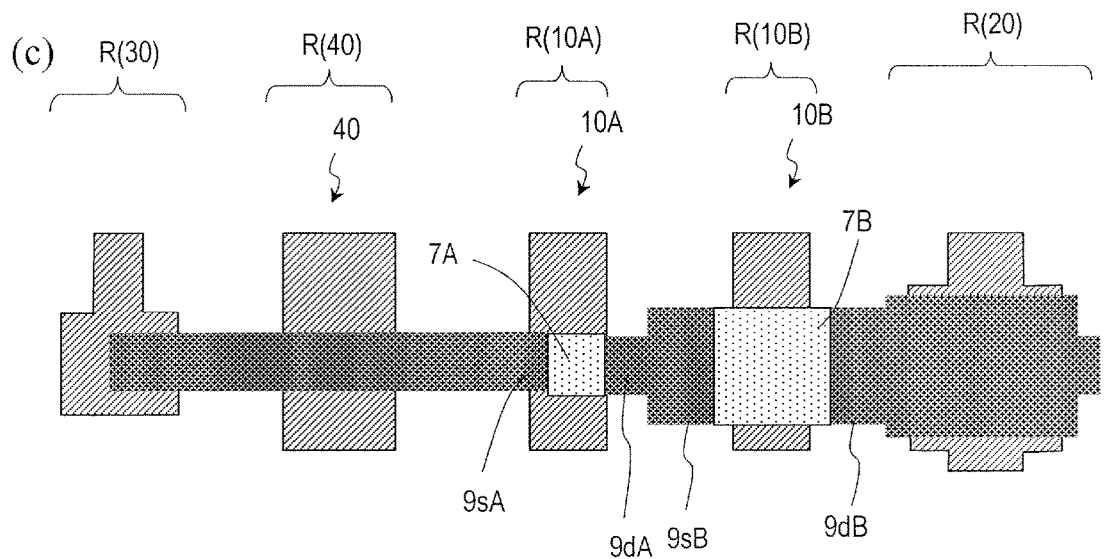
Figure 27:
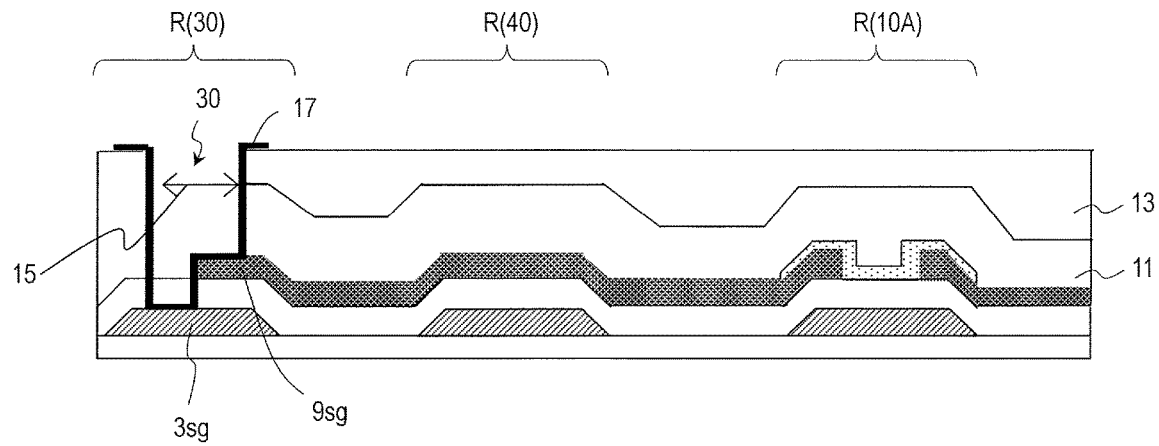
FIG. 27 Process diagrams for illustrating a manufacturing method of a semiconductor device (active matrix substrate 1004) of the third embodiment. (a) and (b) are cross-sectional views. (c) is a top view.
Figure 27:
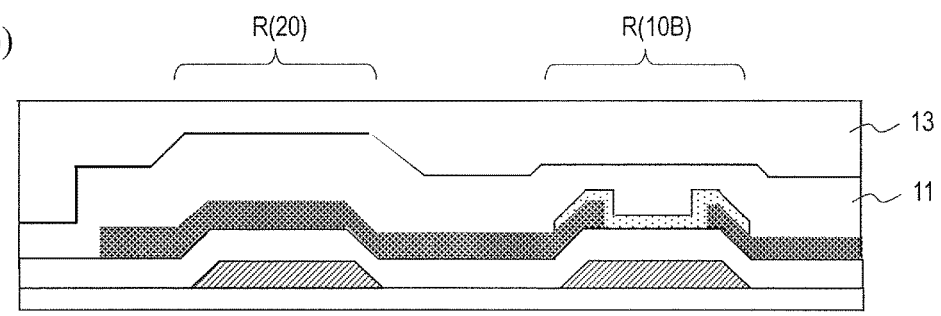
Figure 27:
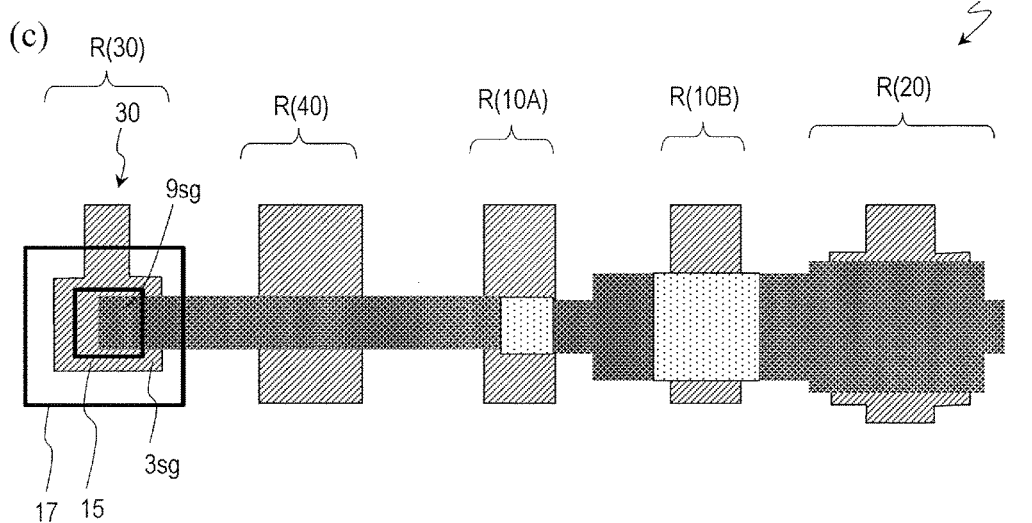

FIG. 25 to FIG. 27 are process diagrams for illustrating an example of the manufacturing method of an active matrix substrate. In respective drawings, (a) and (b) are cross-sectional views, and (c) is a top view. Here, the process of forming the memory transistor 10A, the circuit constituent transistor 10B, the capacitance portion 20, the gate-source contact portion 30 and the gate-source intersection 40 in the active matrix substrate is described.

First, as shown in FIGS. 25(a) to 25(c), an electrically-conductive film for the gate is formed on the substrate 1 and then patterned so as to form a gate wire layer which includes a gate connecting portion 3sg, a gate wire G, a gate electrode 3A, a capacitance wire CS, and a gate electrode 3B. Thereafter, a gate insulating film 5 is formed so as to cover the gate wire layer.

Then, an electrically-conductive film for the source is formed on the gate insulating film 5 and then patterned. Thereby, a source connecting portion 9sg is formed in the gate-source contact formation region R(30). The source connecting portion 9sg is arranged so as to extend over part of the gate connecting portion 3sg when viewed in a direction normal to the substrate 1. Meanwhile, a source wire S is formed in the gate-source intersection formation region R(40), whereby the gate-source intersection 40 is obtained. In the capacitance portion formation region R(20), a capacitance electrode 9cs is formed, whereby the capacitance portion 20 is obtained. The capacitance electrode 9cs is arranged so as to extend over the capacitance wire CS when viewed in a direction normal to the substrate 1. In the memory transistor formation region R(10A) and the circuit constituent transistor formation region R(10B), the source electrode 9sA, 9sB and the drain electrode 9dA, 9dB are spaced away from each other.

The material, thickness, and formation method of the electrically-conductive film for the gate, the gate insulating film, and the electrically-conductive film for the source are the same as those of these films which have been described in the first embodiment.

In the present embodiment, the distance between the source and the drain across the active layer 7A is smaller than the distance between the source and the drain across the active layer 7B. This enables to make channel length L1 of the memory transistor smaller than channel length L2 of the circuit constituent transistor (L1<L2). On the other hand, in the illustrated example, the width of the source electrode 9sA and the drain electrode 9dA in a direction perpendicular to the channel direction (channel width direction) is smaller than the width in the channel width direction of the source electrode 9sB and the drain electrode 9dB. Accordingly, channel width W1 of the memory transistor is smaller than channel width W2 of the circuit constituent transistor (W1<W2). Even in such a case, the effects of the invention of the present application are achieved so long as L1<L2 holds true. Thus, it is only necessary that either one of L1<L2 and W1>W2 holds true. When only either one of them holds true, the effects achieved by the condition that holds true are initiatively controlled, whereby the effects of the invention of the present application are surely achieved. Even when only either one of them holds true, the above-described effects can be more surely achieved by setting the channel length and the channel width such that, for example, L1/W1<L2/W2 holds true.

Then, as shown in FIGS. 26(a) to 26(c), an oxide semiconductor film is formed on the gate insulating film 5 and the source wire layer and then patterned. Thereby, the active layer 7A is formed in the memory transistor formation region R(10A), and the active layer 7B is formed in the circuit constituent transistor formation region R(10B). The active layers 7A, 7B are arranged so as to be in contact with the gate insulating film 5 which is located between the source electrodes 9sA, 7sB and the drain electrodes 9dA, 7dB and with the upper surfaces and lateral surfaces of the source electrodes 9sA, 7sB and the drain electrodes 9dA, 7dB. The material, thickness, and formation method of the oxide semiconductor film are the same as those of the previously-described embodiments. Thus, the memory transistor 10A and the circuit constituent transistor 10B are formed in the memory transistor and circuit constituent transistor formation regions R(10A, 10B).

In the present embodiment, the active layers 7A, 7B are formed after the etching step of the electrically-conductive film for the source. Therefore, damage to the active layers 7A, 7B which is attributed to the etching step can be suppressed.

Then, as shown in FIGS. 27(a) to 27(c), a protection film (passivation film) 11, an organic insulating film 13 of a photosensitive resin or the like, and an upper electrically-conductive layer 17 are formed on the source wire layer and the active layers 7A, 7B. First, the protection film 11 and the organic insulating film 13 are formed in this order in the same way as that of the previously-described embodiments. Then, an opening is formed in part of the organic insulating film 13 extending over the gate-source contact portion formation region R(30). Thereafter, etching is performed on the passivation film 11 using the organic insulating film 13 as a mask. Thereby, a contact hole 15 is obtained through which the gate connecting portion 3sg and the source connecting portion 9sg are exposed. Then, an electrically-conductive film is formed in the contact hole 15 and on the organic insulating film 13 and then patterned. Thereby, an upper electrically-conductive layer 17 is obtained which is electrically connected with the source connecting portion 9sg in the contact hole 15. The material, thickness, and formation method of the protection film 11, the organic insulating film 13 and the electrically-conductive film are the same as those of the previously-described embodiments. In this way, an active matrix substrate 1004 is obtained.

The memory transistor 10A and the circuit constituent transistor 10B of the present embodiment have a bottom contact structure which is configured to be in contact with the source and drain electrodes at the lower surfaces of the active layers 7A, 7B. Such a structure has the following advantages over a transistor which has a channel-etch structure.

In the present embodiment, the active layers 7A, 7B are formed after the etching step of the electrically-conductive film for the source for separation of the source and the drain. Therefore, damage to the channel regions 7cA, 7cB which is caused by the etching can be reduced as compared with a thin film transistor which has a channel-etch structure. Thus, variation of the electric characteristics of the memory transistor 10A and the circuit constituent transistor 10B can be improved. Further, the magnitude of the variation of the electric characteristics which is attributed to the electrical stress can be reduced.

Further, in the present embodiment, the manufacturing process is simplified as compared with an example of the second embodiment which has the etch stop structure. Therefore, advantageously, the manufacturing cost can be reduced, and the yield can be improved.

Note that the operation and the electric characteristics of the memory transistor 10A in the second and third embodiments are the same as those described in the first embodiment. These embodiments are also widely applicable not only to active matrix substrates but also to electronic devices which include a memory circuit, such as an integrated circuit, as is the first embodiment.

Although in the previously-described embodiments bottom gate type thin film transistors are used as the memory transistor 10A and the circuit constituent transistor 10B, they may be top gate type thin film transistors.

Figure 28:
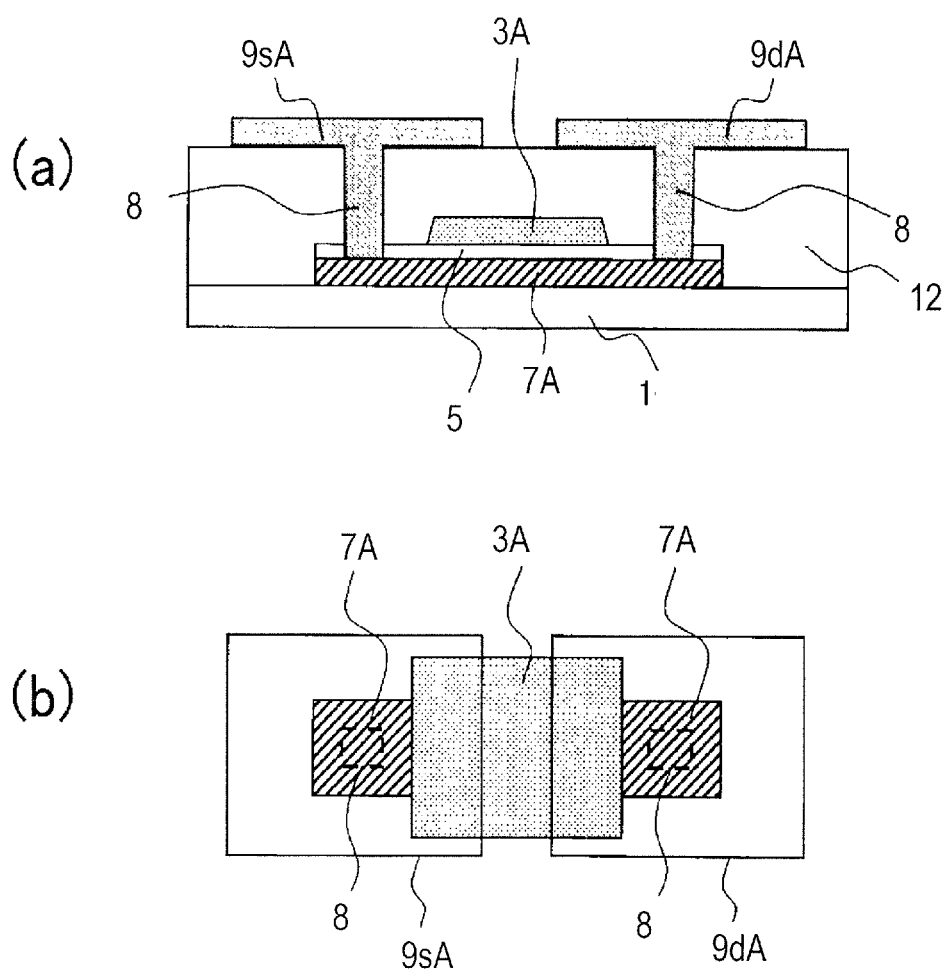
FIG. 28 (a) and (b) are a plan view and cross-sectional view illustrating the configuration of another memory transistor in an embodiment of the present invention.

FIGS. 28(a) and 28(b) are a plan view and cross-sectional view illustrating an example of the memory transistor 10A which has a top gate structure. The cross section shown in FIG. 28(b) is a cross section taken along line A-A' of FIG. 28(a). In FIG. 28, elements which are equivalent to those of FIG. 2 are designated by the same reference numerals.

The memory transistor 10A includes, on the substrate 1, an active layer 7A which includes a metal oxide semiconductor, a gate insulating film 5 which covers the active layer 7A, and a gate electrode 3A provided on the gate insulating film 5. Over these components, an interlayer insulating layer 12 is provided, and a source electrode 9sA and a drain electrode 9dA are provided on the interlayer insulating layer 12. These are in contact with the active layer 7A in contact holes 8 formed in the interlayer insulating layer 12. Although not shown, the circuit constituent transistor 10B may also have the same transistor structure.

The circuit constituent transistor 10B may have a configuration which includes two or more channel regions connected in series or parallel. In such a case, for example, the same effects as those of the previously-described embodiments are achieved so long as channel length L1 of the memory transistor 10A is smaller than the smallest value of the channel lengths of the plurality of channel regions of the circuit constituent transistor 10B. Alternatively, the circuit constituent transistor 10B that has the above-described configuration is approximated to a transistor which provides performance equivalent to that of that transistor and which has a single channel region, and the channel length and the channel width of the approximate transistor may be "channel length L2" and "channel width W2". As an example, the same effects as those of the previously-described embodiments are achieved when channel width W1 of the memory transistor 10A is greater than the channel width of the transistor approximated to the circuit constituent transistor 10B. Note that the "approximate transistor" which provides equivalent performance can be appropriately obtained from known relationships. For example, when the circuit constituent transistor 10B has a channel region a and a channel region b which are connected in parallel, where the channel lengths of the channel region a and the channel region b are "channel length La" and "channel length Lb" and the channel widths are "channel width Wa" and "channel width Wb" and the channel length and the channel width of the "approximate transistor" which provides performance equivalent to that of this composite transistor are L1' and W1', L1' and W1' can be set such that W1'/L1'=Wa/La+Wb/Lb holds true.

Further, the channel regions of the memory transistor 10A and the circuit constituent transistor 10B may have a shape whose length in the channel length direction or channel width direction is nonuniform when viewed in a direction normal to the substrate. When the length in the channel length direction is nonuniform, the smallest value of the lengths in the channel length direction may be "channel length L1, L2". As an example, the same effects as those of the previously-described embodiments are achieved when the smallest value of the lengths in the channel length direction of the memory transistor 10A is smaller than the smallest value of the lengths in the channel length direction of the circuit constituent transistor 10B. Alternatively, the transistors 10A, 10B that have the above-described nonuniform shape are approximated to a transistor which provides performance equivalent to that of that transistor and whose channel length and channel width are constant, and the channel length and the channel width of the approximate transistor may be "channel length L1, L2" and "channel width W1, W2".

Thus, the present invention is also applicable to a case where the memory transistor 10A and the circuit constituent transistor 10B has a configuration which is difficult to determine the channel length and the channel width. In such a case, as illustrated above, for example, the same effects as those of the previously-described embodiments are achieved so long as the smallest value of the lengths in the channel length direction and the channel length and channel width of the approximate transistor are set so as to meet the same relationships as those of the previously-described embodiments.

In the semiconductor device of the present embodiment, a writing operation in the memory transistor 10A is realized by Joule heat produced in the oxide semiconductor layer 7A. The temperature of the channel region 7cA during the writing operation is, for example, not less than 200° C. There is a probability that the temperature is still higher on the drain side of the channel region 7cA (for example, not less than 250° C., or not less than 300° C.). Therefore, it is preferred that a layer of a low heat resistance material (softening temperature: less than 200° C., preferably less than 300° C.), for example, an organic insulating film, is not provided above the oxide semiconductor layer 7A of the memory transistor 10A. Hereinafter, more specific description is provided with an example of an active matrix substrate.

Figure 10:
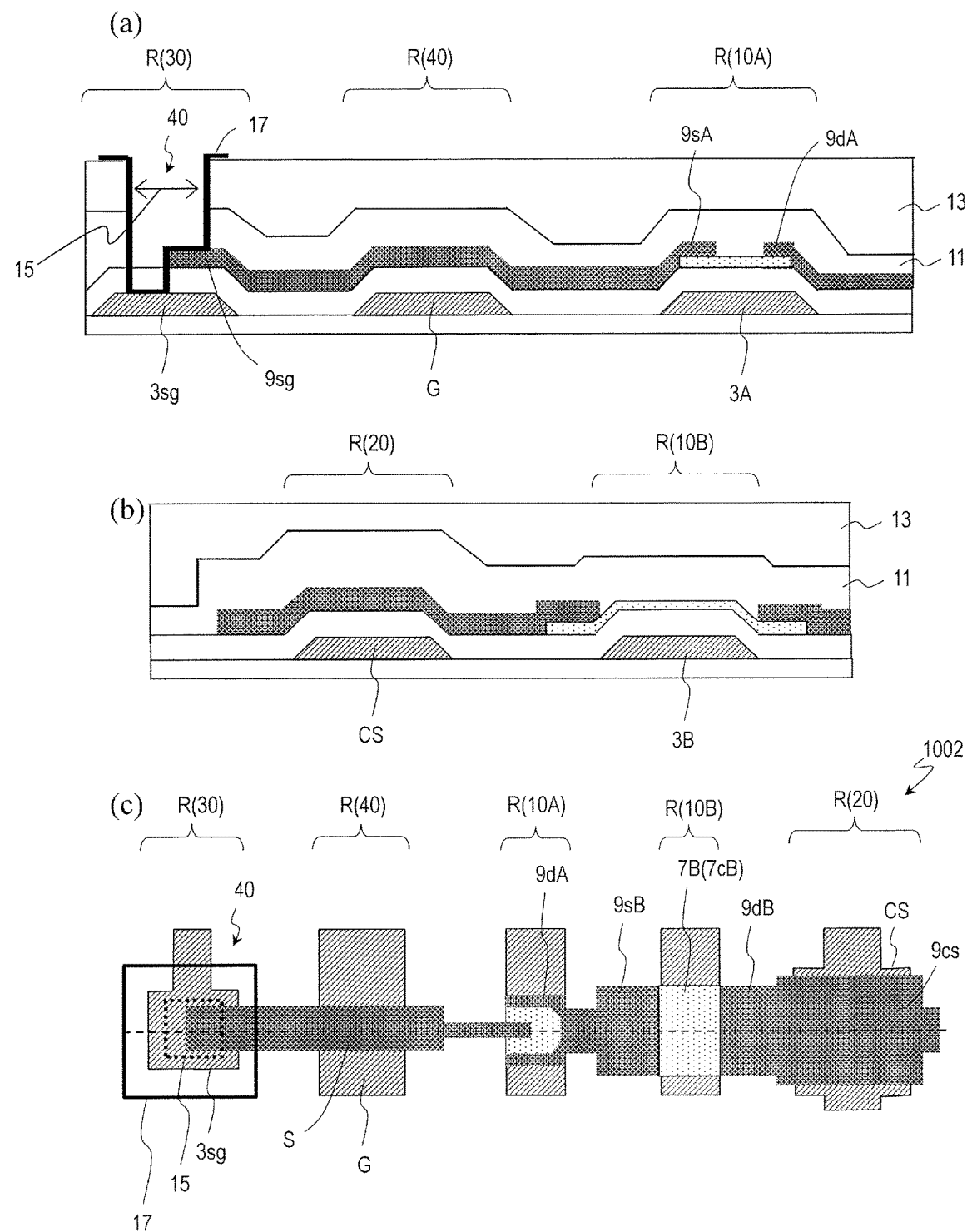
FIG. 10 Process diagrams for illustrating a manufacturing method of a semiconductor device (active matrix substrate 1002) of the first embodiment. (a) and (b) are cross-sectional views. (c) is a top view.
Figure 23:
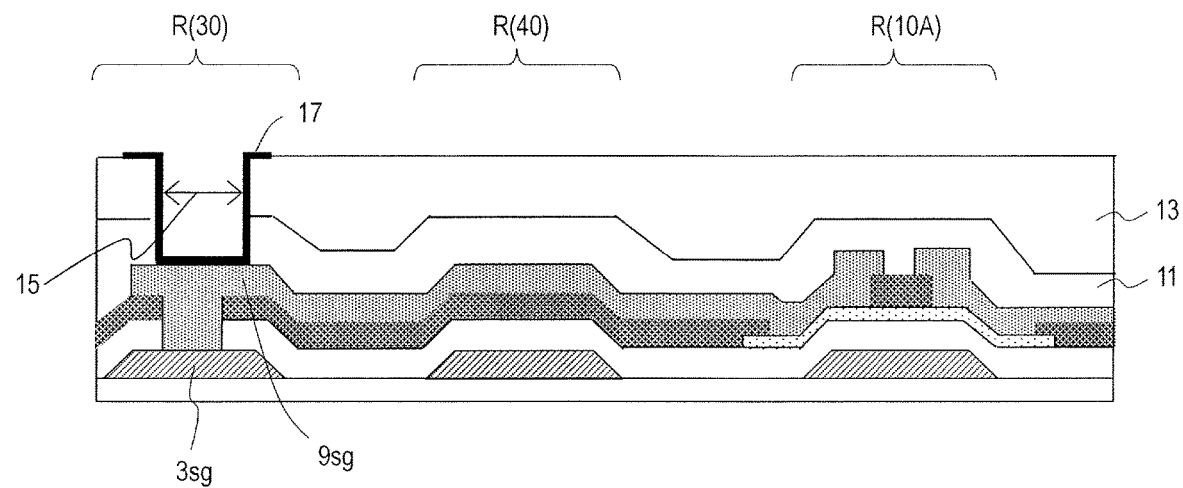
FIG. 23 Process diagrams for illustrating a manufacturing method of a semiconductor device (active matrix substrate 1003) of the second embodiment. (a) and (b) are cross-sectional views. (c) is a top view.
Figure 23:
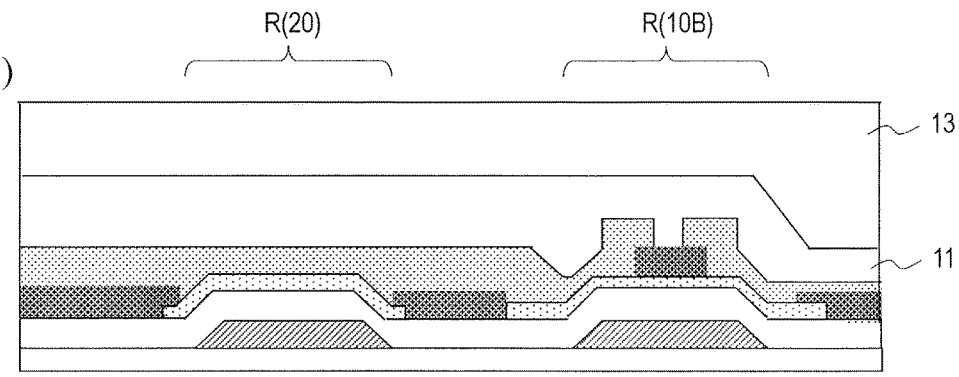
Figure 23:
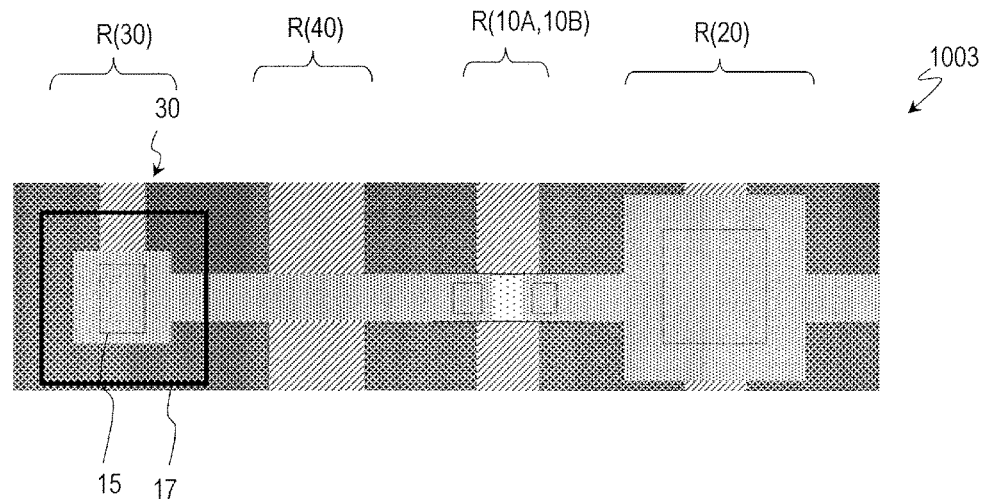

In the active matrix substrates illustrated in FIG. 10, FIG. 23 and FIG. 27, the oxide semiconductor layer 7A of the memory transistor 10A is covered with the passivation film 11 and the organic insulating film 13. If this organic insulating film 13 has low heat resistance, there is a probability that, in some writing conditions, part of the organic insulating film 13 lying above the oxide semiconductor layer 7A peels off from the passivation film 11 or deforms. Particularly, peeling or deformation can occur on an edge of the organic insulating film 13 on the drain side of the oxide semiconductor layer 7A. If peeling or deformation of the organic insulating film 13 occurs, for example, in the case where a memory array is formed using a plurality of memory transistors 10A, there is a probability that a written memory transistor 10A and an unwritten memory transistor 10A are distinguished by the position of peeling or deformation of the organic insulating film 13.

Figure 29:
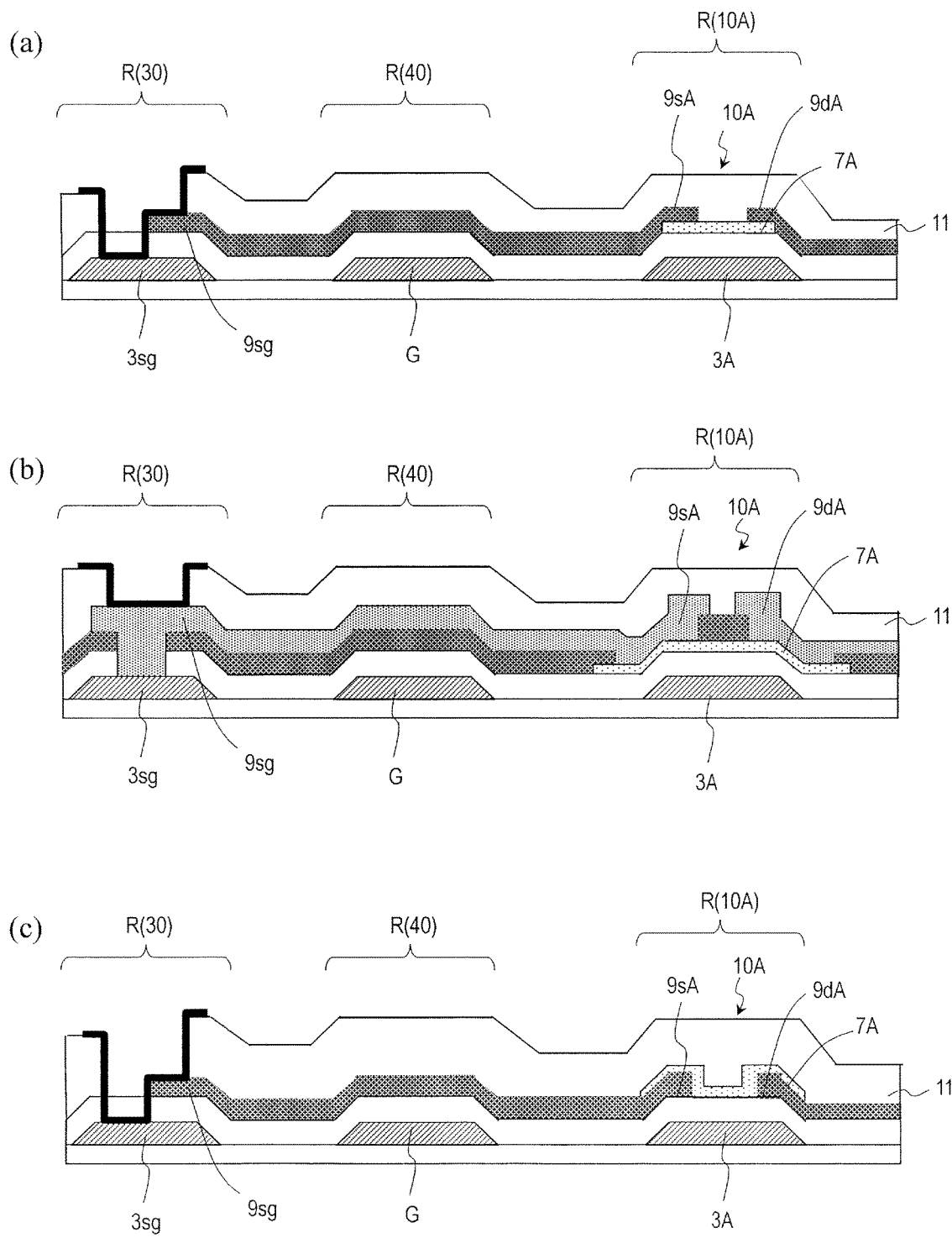
FIG. 29 (a) to (c) are cross-sectional views illustrating the configuration of another semiconductor device in an embodiment of the present invention.

In view of such, as illustrated in FIGS. 29(a) to 29(c), an inorganic insulating film of relatively high heat resistance (the silicon oxide film listed above or the like) may be provided as the passivation film 11 above the oxide semiconductor layer 7A, and the organic insulating film 13 may not be provided on the passivation film 11. Due to this arrangement, the above-described problem which is attributed to the heat produced during writing would not arise, and therefore, the reliability and security of the device can be improved.

An active matrix substrate illustrated in FIGS. 29(a) to 29(c) may not include an organic insulating film as the flattening film. Alternatively, the active matrix substrate may include the organic insulating film 13 only in part of the substrate 1. In this case, it is only necessary that the organic insulating film 13 is not provided at least above the oxide semiconductor layer 7A of the memory transistor 10A. For example, the organic insulating film 13 may be provided above the oxide semiconductor layer 7B of the circuit constituent transistor 10B.

Figure 4:
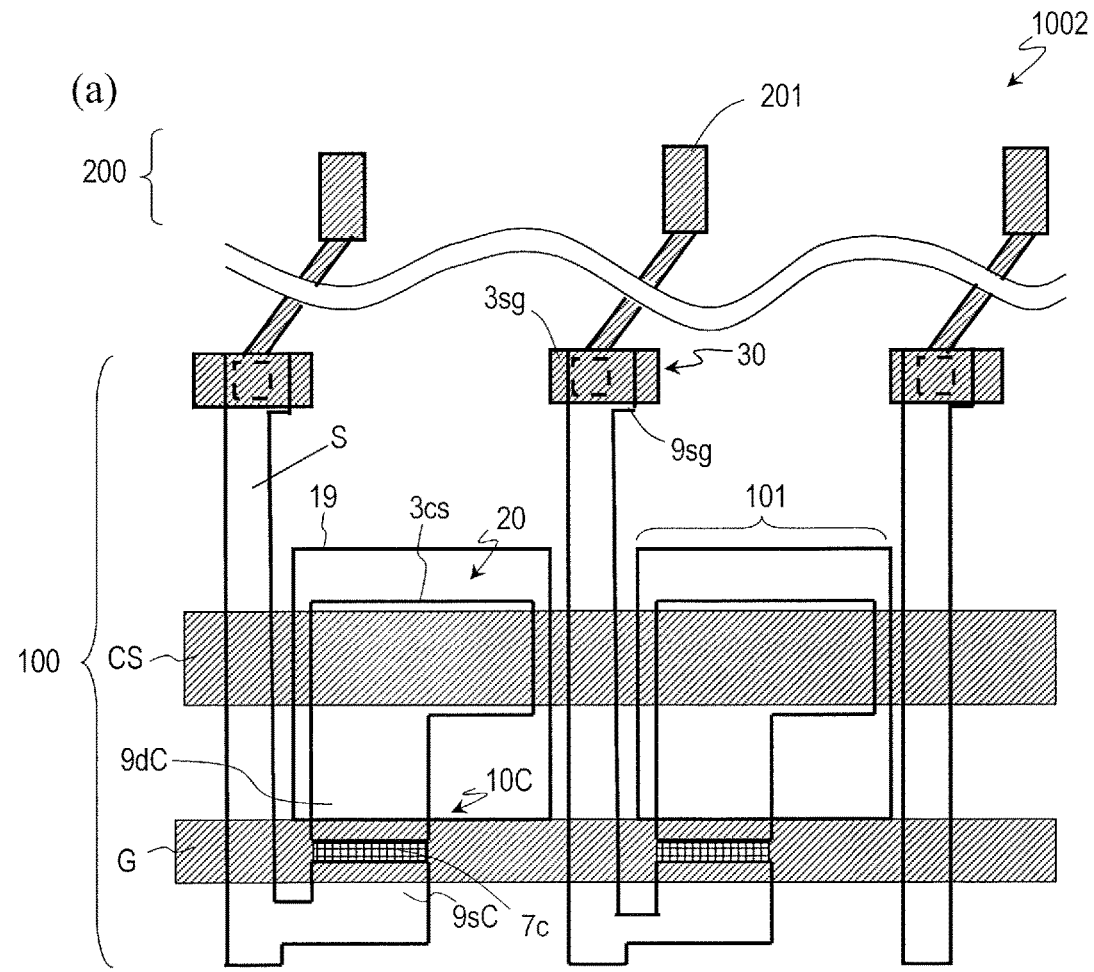
FIG. 4 (a) is a plan view of an active matrix substrate 1002 of the first embodiment. (b) is a cross-sectional view illustrating a display device 2001 in which the active matrix substrate 1002 is used.
Figure 4:
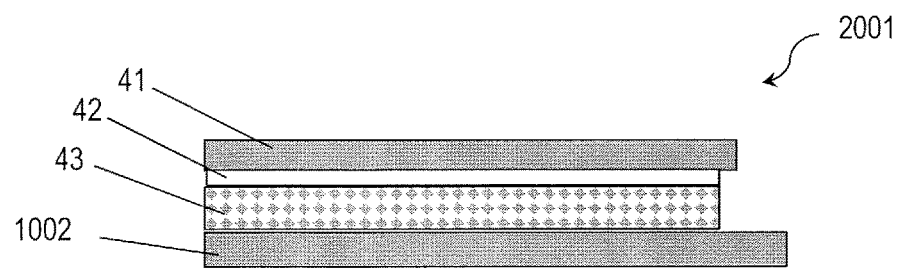

In the active matrix substrate 1002 illustrated in FIG. 4, the organic insulating film 13 is provided above a plurality of pixel transistors 10C and may not be provided above the memory transistor 10A inside the memory circuit. For example, the organic insulating film 13 is provided in the display region 100 and may not be provided in the peripheral region 200 (at least part of the peripheral region 200 overlying the memory circuit).

Note that, in the active matrix substrates illustrated in FIG. 10, FIG. 23 and FIG. 27, the above-described problem which is attributed to the heat produced during writing can be suppressed even when a flattening film of a high heat resistance material (for example, softening temperature: not less than 200° C., preferably not less than 300° C.) is used instead of the organic insulating film 13. For example, an inorganic insulating film, such as an inorganic SOG (spin on glass) film, may be used as the flattening film.

Although in each of the above-described embodiments the memory transistor 10A and the circuit constituent transistor 10B are thin film transistors, they may be MOS type transistors. Even in MOS type transistors, transition to the resistor state can be realized by allowing a drain current of a high current density to flow through the channel region. The MOS type transistor has a configuration where, for example, a metal oxide semiconductor film is provided on a silicon substrate with an insulating film interposed therebetween. In such a configuration, a silicon substrate of high heat radiation is used, but the silicon substrate and the oxide semiconductor film are separated by the insulating film, and therefore, transfer of the Joule heat produced by the write current to the silicon substrate can be suppressed. Thus, the resistance of the oxide semiconductor film can be reduced by the Joule heat.

The conductivity type of the memory transistor 10A and the circuit constituent transistor 10B is not limited to the n-channel type but may be the p-channel type. The material, configuration, thickness, transistor characteristics, and writing characteristics of the electrically-conductive films and insulating films which are constituents of the memory transistor 10A and the circuit constituent transistor 10B are not limited to those described in the above-described embodiments.

INDUSTRIAL APPLICABILITY

An embodiment of the present invention is applicable to a wide variety of semiconductor devices and electronic devices which include a memory circuit. For example, it is applicable to nonvolatile semiconductor storage devices, integrated circuits (IC, LSI), various display devices, such as liquid crystal display devices and organic EL display devices, and active matrix substrates for use in various display devices.

REFERENCE SIGNS LIST 1 substrate
3A, 3B gate electrode
3sg gate connecting portion
5 gate insulating film
7A, 7B active layer
7cA, 7cB channel region
9dA, 9dB drain electrode
9sA, 9sB source electrode
9cs capacitance electrode
9sg source connecting portion
10A memory transistor
10B circuit constituent transistor
10C pixel transistor
10D, 10E select transistor
11 protection film (passivation film)
13 organic insulating film
15 contact hole
17 upper electrically-conductive layer
18 upper gate electrode
19 pixel electrode
20 capacitance portion
30 source contact portion
31 protection layer
32s, 32d, 33, 34 opening
40 source intersection
100 display region
101 pixel
200 peripheral region
201 terminal portion
1001 semiconductor device
1002, 1003, 1004 active matrix substrate
CS capacitance wire
G gate wire
S source wire

The invention claimed is:
1. A semiconductor device, comprising:
a substrate;
a first transistor supported on the substrate, the first transistor having a first channel length L1 and a first channel width W1; and
a second transistor supported on the substrate, the second transistor having a second channel length L2 and a second channel width W2, wherein
the first transistor and the second transistor include an active layer made of a common oxide semiconductor film,
the first transistor is a memory transistor which is capable of being irreversibly changed from a semiconductor state where a drain current lsd depends on a gate voltage Vg to a resistor state where the drain current lsd does not depend on the gate voltage Vg, and
the first channel length L1 is smaller than the second channel length L2,
each of the first transistor and the second transistor includes:
a gate electrode,
a gate insulating film covering the gate electrode,
an active layer on the gate insulating film,
a source electrode on the active layer and in contact with a portion of the active layer, and
a drain electrode on the active layer and in contact with another portion of the active layer,
in the first transistor, when viewed in a direction normal to the substrate, a first portion of the active layer which extends over the gate electrode with the gate insulating film interposed therebetween and which is between the source electrode and the drain electrode has a U-shape, and
in the second transistor, when viewed in the direction normal to the substrate, a second portion of the active layer which extends over the gate electrode with the gate insulating film interposed therebetween and which is between the source electrode and the drain electrode has a rectangular shape.

2. The semiconductor device of claim 1, wherein a ratio L1/W1 of the channel length to the channel width in the first transistor, is smaller than a ratio L2/W2 of the channel length to the channel width in the second transistor.

3. The semiconductor device of claim 1, further comprising a memory circuit which includes the first transistor, wherein the second transistor includes a transistor which is a constituent of the memory circuit.

4. The semiconductor device of claim 3, wherein
the memory circuit includes a plurality of memory cells,
each of the plurality of memory cells includes the first transistor and at least one select transistor for memory cell selection,
the at least one select transistor is the second transistor, and
the first transistor and the second transistor are connected in series.

5. The semiconductor device of claim 4, wherein the at least one select transistor includes two or more select transistors that are connected in parallel.

6. The semiconductor device of claim 1, wherein
the substrate includes a power supply domain region which includes the first transistor, and
the second transistor includes a transistor which is a constituent of a circuit provided in the power supply domain region.

7. The semiconductor device of claim 6, wherein the channel length L1 of the first transistor is not more than a smallest value of channel lengths of all transistors provided in the power supply domain region, each of which includes an active layer made of the common oxide semiconductor film.

8. The semiconductor device of claim 1, wherein
the semiconductor device is an active matrix substrate, the active matrix substrate including
a display region which includes a plurality of pixel electrodes and switching elements each electrically connected with a corresponding one of the plurality of pixel electrodes, and
a peripheral region provided in a region other than the display region, the peripheral region including a plurality of circuits, and
the second transistor includes at least one of a plurality of transistors which are constituents of the plurality of circuits in the peripheral region.

9. The semiconductor device of claim 8, wherein the channel length L1 of the first transistor is not more than a smallest value of channel lengths of all transistors provided in the peripheral region, each of which has an active layer made of the common oxide semiconductor film.

10. The semiconductor device of claim 8, wherein the second transistor includes a transistor which functions as the switching element.

11. The semiconductor device of claim 1, wherein a ratio L1/W1 of the channel length to the channel width in the first transistor, is not more than a smallest value of ratios of a channel length to a channel width in all transistors which have an active layer made of the common oxide semiconductor film.

12. The semiconductor device of claim 1, wherein the common oxide semiconductor film is an In—Ga—Zn—O based semiconductor film.

13. The semiconductor device of claim 12, wherein the In—Ga—Zn—O based semiconductor film includes a crystalline portion.

14. The semiconductor device of claim 1, wherein
when the first transistor is in the semiconductor state, while an absolute value of a voltage between the source electrode and the drain electrode is in a range of not less than 0.1 V and not more than 10 V, there is a voltage range for the gate voltage in which an absolute value of a drain current per unit channel width, Ids/W1, falls in an electric current state of not more than $1 \times 10^{-14}$ A/μm, and
after transition to the resistor state, even when the gate voltage is set within the voltage range while the absolute value of the voltage between the source electrode and the drain electrode is in a range of not less than 0.1 V and not more than 10 V, an absolute value of a drain current per unit channel width, Ids/W1, falls in an electric current state of not less than $1 \times 10^{-11}$ A/μm according to the voltage between the source electrode and the drain electrode.

15. The semiconductor device of claim 1, wherein the first transistor and the second transistor are thin film transistors.

16. The semiconductor device of claim 1, wherein the first transistor and the second transistor are connected in series.

17. The semiconductor device of claim 1, wherein the first transistor further includes an upper gate electrode above the active layer with an interlayer insulating layer interposed therebetween, the upper gate electrode arranged to overlap at least the first portion of the active layer when viewed in the direction normal to the substrate.

18. A semiconductor device, comprising:
a substrate;
a first transistor supported on the substrate, the first transistor having a first channel length L1 and a first channel width W1; and
a second transistor supported on the substrate, the second transistor having a second channel length L2 and a second channel width W2, wherein
the first transistor and the second transistor include an active layer made of a common oxide semiconductor film,
the first transistor is a memory transistor which is capable of being irreversibly changed to a resistor state where a drain current lsd does not depend on a gate voltage Vg, and
the first channel width W1 is greater than the second channel width W2 and L1<L2,
each of the first transistor and the second transistor includes:
a gate electrode,
a gate insulating film covering the gate electrode,
an active layer on the gate insulating film,
a source electrode on the active layer and in contact with a portion of the active layer, and
a drain electrode on the active layer and in contact with another portion of the active layer,
in the first transistor, when viewed in a direction normal to the substrate, a first portion of the active layer which extends over the gate electrode with the gate insulating film interposed therebetween and which is between the source electrode and the drain electrode has a U-shape, and
in the second transistor, when viewed in the direction normal to the substrate, a second portion of the active layer which extends over the gate electrode with the gate insulating film interposed therebetween and which is between the source electrode and the drain electrode has a rectangular shape.

19. A semiconductor device, comprising:

a substrate;

a first transistor supported on the substrate, the first transistor having a first channel length L1 and a first channel width W1; and a second transistor supported on the substrate, the second transistor having a second channel length L2 and a second channel width W2, wherein the first transistor and the second transistor include an active layer made of a common oxide semiconductor film, wherein the first transistor is a memory transistor which is capable of being irreversibly changed from a semiconductor state where a drain current lsd depends on a gate voltage Vg to a resistor state where the drain current lsd does not depend on the gate voltage Vg, the first channel length L1 is smaller than the second channel length L2, the first transistor includes:
  a gate electrode,
  a gate insulating film covering the gate electrode,
  an active layer on the gate insulating film,
  a source electrode on the active layer and in contact with a portion of the active layer, and
  a drain electrode on the active layer and in contact with another portion of the active layer, when viewed in a direction normal to the substrate, a first portion of the active layer which extends over the gate electrode with the gate insulating film interposed therebetween and which is between the source electrode and the drain electrode has a U-shape, and the first transistor further includes an upper gate electrode above the active layer with an interlayer insulating layer interposed therebetween, the upper gate electrode arranged to overlap at least the first portion of the active layer when viewed in the direction normal to the substrate.

* * * * *